(12) United States Patent
Hirano et al.

(10) Patent No.: US 11,688,461 B2
(45) Date of Patent: *Jun. 27, 2023

(54) 3D MEMORY DEVICE

(71) Applicant: Samsung Electronics Co., Ltd., Suwon-si (KR)

(72) Inventors: Makoto Hirano, Seongnam-si (KR); Jinyoung Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/705,613

(22) Filed: Mar. 28, 2022

(65) Prior Publication Data

US 2022/0215879 A1 Jul. 7, 2022

Related U.S. Application Data

(63) Continuation of application No. 17/021,409, filed on Sep. 15, 2020, now Pat. No. 11,315,631.

(30) Foreign Application Priority Data

Jan. 28, 2020 (KR) ........................ 10-2020-0010031

(51) Int. Cl.
*G11C 11/00* (2006.01)
*G11C 13/00* (2006.01)

(52) U.S. Cl.
CPC ........ *G11C 13/0028* (2013.01); *G11C 13/004* (2013.01); *G11C 13/0026* (2013.01); *G11C 2213/71* (2013.01); *G11C 2213/79* (2013.01)

(58) Field of Classification Search
CPC ............ G11C 13/0028; G11C 13/0026; G11C 13/004; G11C 2213/71; G11C 2213/79; G11C 2213/76; G11C 13/0004; G11C 13/0002; G11C 13/0069; G11C 8/04; G11C 13/0021
See application file for complete search history.

(56) References Cited

U.S. PATENT DOCUMENTS

| | | |
|---|---|---|
| 8,243,493 B2 | 8/2012 | Toda |
| 8,582,345 B2 | 11/2013 | Hosono |
| 8,681,540 B2 | 3/2014 | Zeng |
| 9,058,874 B2 | 6/2015 | Choi et al. |
| 9,142,271 B1 | 9/2015 | Srinivasan et al. |
| 9,286,975 B2 | 3/2016 | Chu et al. |

(Continued)

*Primary Examiner* — Hien N Nguyen
(74) *Attorney, Agent, or Firm* — Muir Patent Law, PLLC

(57) ABSTRACT

A three-dimensional (3D) memory device includes a memory cell array, a first sense amplifier and a second sense amplifier. The memory cell array includes lower memory cells respectively arranged in regions where lower word lines intersect with bit lines and upper memory cells respectively arranged in regions where upper word lines intersect with the bit lines. The first sense amplifier is connected to a first lower word line and performs a data sensing operation on a first lower memory cell connected between a first bit line and the first lower word line. The second sense amplifier is connected to a first upper word line and performs a data sensing operation on a first upper memory cell connected between the first bit line and the first upper word line. The data sensing operations of the first and second sense amplifiers are performed in parallel.

20 Claims, 26 Drawing Sheets

(56) References Cited

U.S. PATENT DOCUMENTS

| | | |
|---|---|---|
| 9,312,005 B2 | 4/2016 | Castro |
| 9,934,850 B2 | 4/2018 | Castro |
| 11,315,631 B2 * | 4/2022 | Hirano ............... G11C 13/0004 |
| 2010/0322000 A1 | 12/2010 | Shim et al. |
| 2015/0255166 A1 | 9/2015 | Tseng et al. |

* cited by examiner

3D MEMORY DEVICE

CROSS-REFERENCE TO RELATED APPLICATION(S)

This application is a Continuation of U.S. patent application Ser. No. 17/021,409 filed on Sep. 15, 2020, now Allowed, which claims priority under 35 USC § 119 to Korean Patent Application No. 10-2020-0010031, filed on Jan. 28, 2020, in the Korean Intellectual Property Office, the disclosure of each of which is incorporated herein in its entirety by reference.

BACKGROUND

The inventive concept relates to a memory device, and more particularly, to a three-dimensional (3D) memory device and a method of operating the 3D memory device.

As non-volatile memory devices, flash memories and resistive memory devices, such as phase change random access memory (PRAM), nano floating gate memory (NFGM), polymer RAM (PoRAM), magnetic RAM (MRAM), ferroelectric RAM (FeRAM), and resistive RAM (RRAM) are known. A resistive memory device may have the high speed of DRAM and non-volatile characteristics of flash memory. Memory cells of the resistive memory device may have a resistance distribution according to programmed data. In the operation of reading data stored in the memory cells, data may be sensed by applying a constant current or voltage to a memory cell and reading a voltage that varies according to the resistance of the memory cell. As the demand for highly integrated memory devices has increased, it is necessary to reduce a power consumption of the memory device.

SUMMARY

According to an aspect of the inventive concept, there is provided a three-dimensional (3D) memory device including: a memory cell array including a plurality of lower memory cells respectively arranged in regions where a plurality of lower word lines intersect with a plurality of bit lines and a plurality of upper memory cells respectively arranged in regions where a plurality of upper word lines intersect with the plurality of bit lines, a first sense amplifier connected to a first lower word line of the plurality of lower word lines, the first sense amplifier comparing a voltage of the first lower word line with a first reference voltage to perform a data sensing operation on a first lower memory cell connected between a first bit line of the plurality of bit lines and the first lower word line, and a second sense amplifier connected to a first upper word line of the plurality of upper word lines, the second sense amplifier comparing a voltage of the first upper word line with a second reference voltage to perform a data sensing operation on a first upper memory cell connected between the first bit line and the first upper word line, wherein the data sensing operation of the first sense amplifier and the data sensing operation of the second sense amplifier are performed in parallel.

According to another aspect of the inventive concept, there is provided a three-dimensional (3D) memory device including: a first semiconductor layer and a second semiconductor layer stacked in a vertical direction, wherein the first semiconductor layer includes a memory cell array including a plurality of lower memory cells respectively arranged in regions where a plurality of lower word lines intersect with a plurality of bit lines and a plurality of upper memory cells respectively arranged in regions where a plurality of upper word lines intersect with the plurality of bit lines, and wherein the second semiconductor layer includes: a first sense amplifier connected to a first lower word line of the plurality of lower word lines, the first sense amplifier performing a data sensing operation on a first lower memory cell connected between a first bit line of the plurality of bit lines and the first lower word line; and a second sense amplifier connected to a first upper word line of the plurality of upper word lines, the second sense amplifier performing a data sensing operation on a first upper memory cell connected between the first bit line and the first upper word line.

According to another aspect of the inventive concept, there is provided a three-dimensional (3D) memory device including: a memory cell array including a plurality of lower memory cells respectively arranged in regions where a plurality of lower word lines intersect with a plurality of bit lines and a plurality of upper memory cells respectively arranged in regions where a plurality of upper word lines intersect with the plurality of bit lines, a first row decoder including a plurality of lower row switches respectively connected to a corresponding one of the plurality of lower word lines, the first row decoder performing a selection operation on the plurality of lower word lines, a second row decoder including a plurality of upper row switches respectively connected to a corresponding one of the plurality of upper word lines, the second row decoder performing a selection operation on the plurality of upper word lines, a first sense amplifier connected to a first lower word line of the plurality of lower word lines, the first sense amplifier performing a data sensing operation on a first lower memory cell connected between a first bit line among the plurality of bit lines and the first lower word line, and a second sense amplifier connected to a first upper word line of the plurality of upper word lines, the second sense amplifier performing a data sensing operation on a first upper memory cell connected between the first bit line and the first upper word line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, some example embodiments of the inventive concept will be described in detail with reference to the accompanying drawings.

Figure 1:
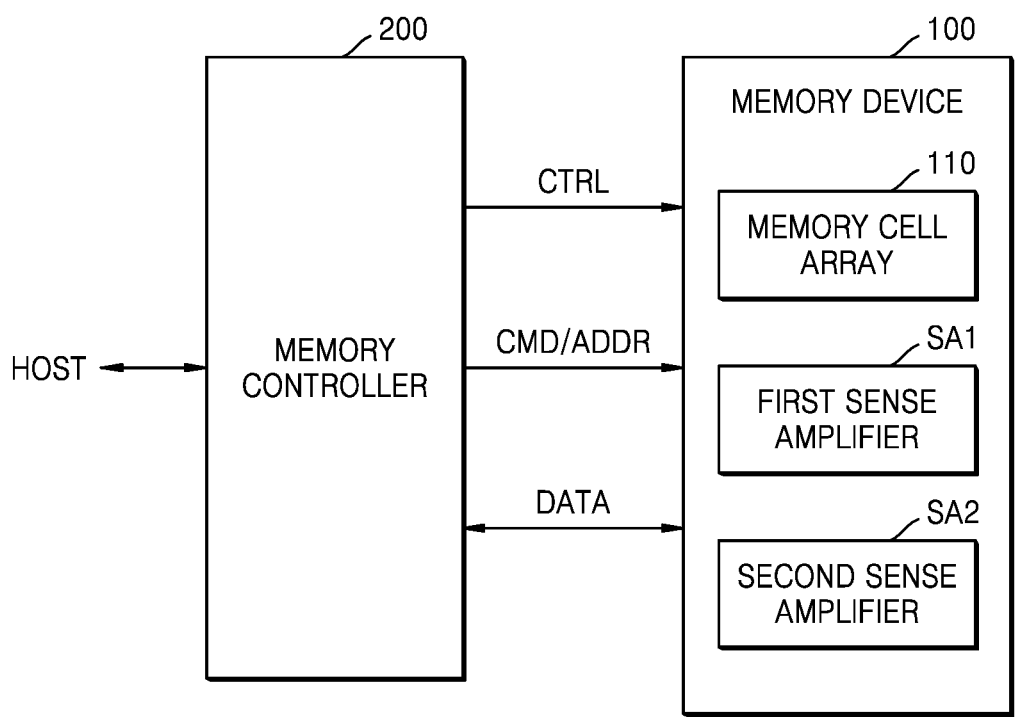
FIG. 1 is a block diagram of a memory system according to an embodiment of the inventive concept.

FIG. 1 is a block diagram of a memory system 10 according to an embodiment of the inventive concept.

Referring to FIG. 1, the memory system 10 may include a memory device 100 and a memory controller 200, and the memory device 100 may include a memory cell array 110, a first sense amplifier SA1, and a second sense amplifier SA2. In an embodiment, the memory cell array 110 may include a plurality of resistive memory cells, and the memory device 100 may be referred to as a "resistive memory device". However, the inventive concept is not limited thereto, and the memory cell array 110 may include various types of other memory cells.

The memory device 100 may be implemented in various forms. As an example, the memory device 100 may be a device implemented with one memory chip or one memory die. Alternatively, the memory device 100 may be defined as a device including a plurality of memory chips, and as an example, the memory device 100 may be a memory module in which a plurality of memory chips are mounted on a board. However, embodiments of the inventive concept are not limited thereto, and the memory device 100 may be implemented in various forms such as a semiconductor package including memory dies.

The memory controller 200 may control the memory device 100 to read data stored in the memory device 100 or write data to the memory device 100 in response to a write/read request from a host HOST. Specifically, the memory controller 200 may provide an address ADDR, a command CMD, and a control signal CTRL to the memory device 100 to control program (or write), read, and erase operations, etc. on the memory device 100. Also, write data DATA and read data DATA may be transmitted and received between the memory controller 200 and the memory device 100.

The memory cell array 110 may include a plurality of memory cells respectively arranged in regions where a plurality of first signal lines intersect with a plurality of second signal lines. In an embodiment, the first signal line may be one of a bit line and a word line, and the second signal line may be the other of the bit line and the word line. Accordingly, the memory device 100 may be referred to as a "cross-point memory device".

Each of the plurality of memory cells may be a single level cell storing one bit, or a multi-level cell capable of storing at least 2 bits or more of data. Also, the memory cells may have a plurality of resistance distributions according to the number of bits stored in each memory cell. For example, when one bit of data is stored in each memory cell, the memory cells may have two resistance distributions, and when two bits of data are stored in each memory cell, the memory cells may have four resistance distributions.

The memory cell array 110 may include resistive memory cells, each of which includes a variable resistor element (or referred to as "variable resistance element"). For example, when the variable resistor element includes a phase change material and the resistance of the variable resistor element changes with temperature, the resistive memory device may be PRAM. As another example, when the variable resistor element includes an upper electrode, a lower electrode, and a complex metal oxide therebetween, the resistive memory device may be RRAM. As another example, when the variable resistor element includes an upper electrode of a magnetic material, a lower electrode of a magnetic material, and a dielectric material therebetween, the resistive memory device may be MRAM. Hereinafter, the term "memory cell" will be used to refer to a resistive memory cell.

The memory cell array 110 may include a plurality of layers, each including a plurality of resistive memory cells, and layers adjacent to each other may be configured to share signal lines (e.g., bit lines). Accordingly, the memory device 100 may be referred to as a "three-dimensional (3D) resistive memory device". Hereinafter, an embodiment in which the memory device 100 is a 3D resistive memory device will be mainly described.

In an embodiment, the memory cell array 110 may include a first layer (e.g., a first layer 310a in FIG. 12) and a second layer (e.g., a second layer 310b in FIG. 12), the first sense amplifier SA1 may be connected to the first layer, and the second sense amplifier SA2 may be connected to the second layer. A connection relationship between the memory cell array 110 and the first and second sense amplifiers SA1 and SA2 will be described in more detail with reference to FIG. 3.

Figure 2:
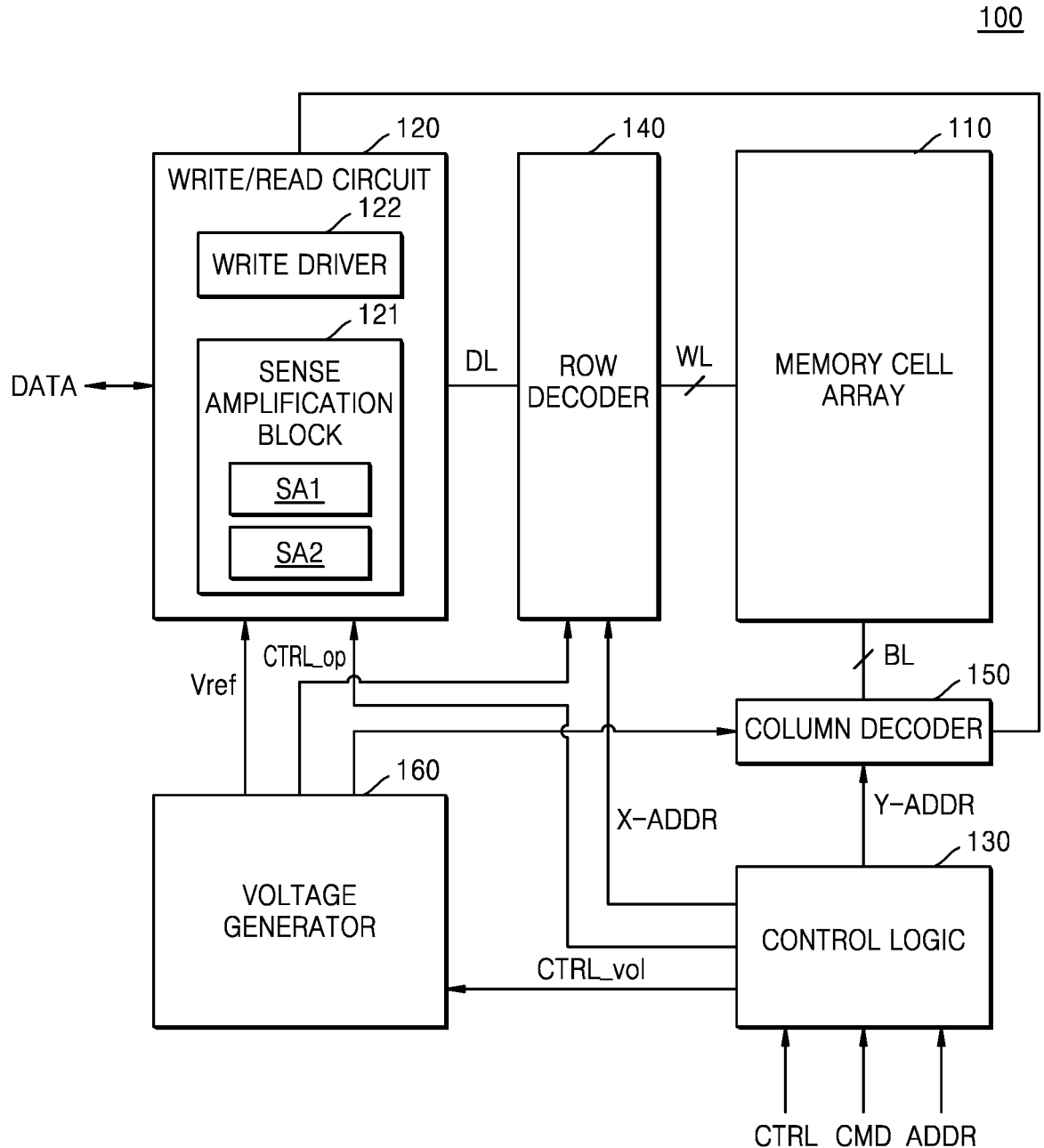
FIG. 2 is a block diagram of a memory device of FIG. 1 according to an embodiment of the inventive concept.

FIG. 2 is a block diagram of the memory device 100 of FIG. 1 according to an embodiment of the inventive concept.

Referring to FIG. 2, the memory device 100 may include a memory cell array 110, a write/read circuit 120, a control logic 130, a row decoder 140, a column decoder 150, and a voltage generator 160. The write/read circuit 120 may include a sense amplification block 121 and a write driver 122. The sense amplification block 121 may include at least a first sense amplifier SA1 and a second sense amplifier SA2.

The memory cell array 110 may be connected to a plurality of first signal lines and a plurality of second signal lines. Also, the memory cell array 110 may include a plurality of memory cells respectively arranged in regions where the plurality of first signal lines intersect with the plurality of second signal lines. Hereinafter, the case where the plurality of first signal lines are word lines WL and the plurality of second signal lines are bit lines BL will be described as an example.

The write/read circuit 120 may provide a constant voltage or current to a selected memory cell through a selected word line or a selected bit line, which is connected to the selected memory cell, during data write and read operations on the selected memory cell among the plurality of memory cells. For example, when a read operation is performed, the write/read circuit 120 may provide pre-charge voltages to the selected word line and/or the selected bit line, and then may sense a voltage level of the selected word line or the selected bit line.

The sense amplification block 121 may be selectively connected to the bit line BL and/or the word line WL and may read data written to the selected memory cell. For example, the sense amplification block 121 may detect a voltage from a word line WL connected to the selected memory cell, amplify the detected voltage, and output read data DATA. The write driver 122 may be selectively connected to the bit line BL and/or the word line WL and may provide a write current to the selected memory cell. As a result, the write driver 122 may program data DATA to be stored in the memory cell array 110.

The control logic 130 may output various control signals required for writing data to the memory cell array 110 or reading data from the memory cell array 110, based on the command CMD, the address ADDR, and the control signal CTRL received from the memory controller 200 in FIG. 1. Specifically, the control logic 130 may provide an operation select signal CTRL_op to the write/read circuit 120, provide a row address X_ADDR to the row decoder 140, provide a column address Y_ADDR to the column decoder 150, and provide a voltage control signal CTRL_vol to the voltage generator 160.

In an embodiment, the control logic 130 may control the first and second sense amplifiers SA1 and SA2 such that a data read operation performed on a first lower memory cell arranged in a first layer and a data read operation performed on a first upper memory cell arranged in a second layer are performed in parallel. Specifically, the control logic 130 may control a pre-charge operation to be performed on a first lower word line and a first upper word line in a word line pre-charge period, and may control a pre-charge operation for a first bit line in a bit line pre-charge period after the word line pre-charge period. For example, the memory device may further include a first word line pre-charge circuit configured to apply a first word line pre-charge voltage to the first lower word line in the word line pre-charge period, a second word line pre-charge circuit configured to apply a second word line pre-charge voltage to the first upper word line in the word line pre-charge period, and a bit line pre-charge circuit configured to apply a bit line pre-charge voltage to the first bit line in the bit line pre-charge period, and a voltage level of each of the first and second word line pre-charge voltages is a negative voltage. A read control operation of the control logic 130 will be described later with reference to FIGS. 9 to 11.

The voltage generator 160 may generate various types of voltages required for performing write, read, and erase operations on the memory cell array 110 based on the voltage control signal CTRL_vol. The row decoder 140 may be connected to the memory cell array 110 through a plurality of word lines WL and may activate a selected word line among the plurality of word lines WL in response to the row address X_ADDR. The column decoder 150 may be connected to the memory cell array 110 through a plurality of bit lines BL and may activate a selected bit line among the plurality of bit lines BL in response to the column address Y_ADDR.

Figure 3:
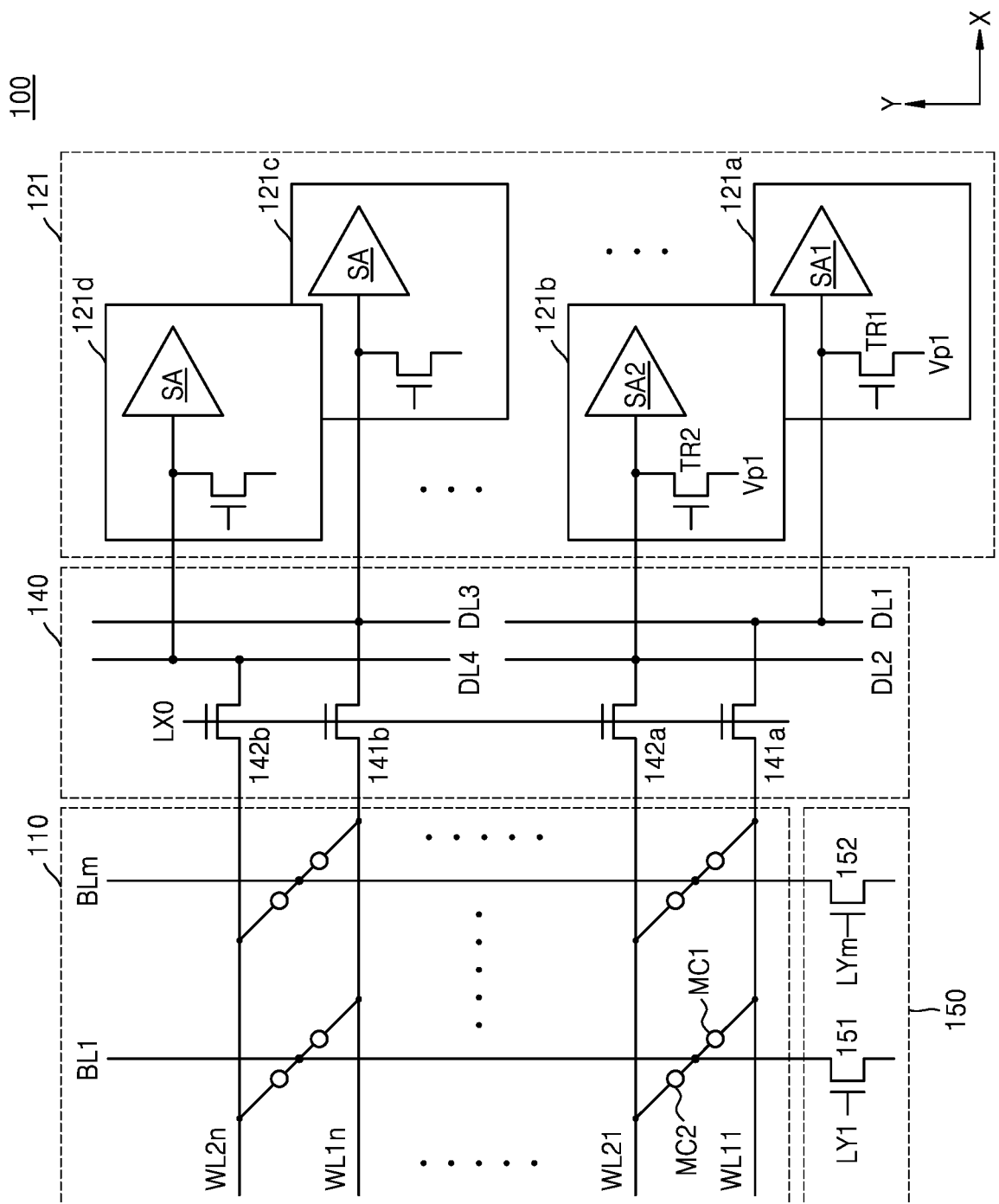
FIG. 3 illustrates a portion of the memory device of FIG. 2 in more detail, according to an embodiment of the inventive concept.

FIG. 3 illustrates a portion of the memory device 100 of FIG. 2 in more detail, according to an embodiment of the inventive concept.

Referring to FIG. 3, the memory cell array 110 may include lower memory cells or first memory cells MC1, which are respectively arranged in regions where lower word lines WL11 to WL1n intersect with bit lines BL1 to BLm, and upper memory cells or second memory cells MC2, which are respectively arranged in regions where upper word lines WL21 to WL2n intersect with the bit lines BL1 to BLm. Here, m and n may be integers of 2 or more. In this case, the first memory cells MC1 may correspond to a first layer or a lower layer, and the second memory cells MC2 may correspond to a second layer or an upper layer. However, the inventive concept is not limited thereto, and the memory cell array 110 may have a structure in which three or more layers are vertically stacked.

The row decoder 140 may be arranged between the memory cell array 110 and the sense amplification block 121 and may include row switches 141a, 141b, 142a, and 142b. In an embodiment, first row switches 141a and 141b and second row switches 142a and 142b may be turned on or off according to a word line select signal LX0. For example, the word line select signal LX0 may be generated from the row decoder 140 based on the row address X_ADDR. However, the inventive concept is not limited thereto. The row decoder 140 may include first row switches 141a and 141b respectively connected to the lower word lines WL11 to WL1n and performing a selection operation on corresponding lower word lines and second row switches 142a and 142b respectively connected to the upper word lines WL21 to WL2n and performing a selection operation on the corresponding upper word line. According to an embodiment, the row decoder 140 may include a first row decoder including the first row switches 141a and 141b and a second row decoder including the second row switches 142a and 142b.

The column decoder 150 may include column switches 151 and 152 connected to bit lines BL1 to BLm, respectively, and performing a selection operation on the corresponding bit lines. The column switches 151 and 152 may be respectively turned on or off according to bit line select signals LY1 and LYm corresponding thereto, and accordingly, the column decoder 150 may select one of the bit lines BL1 to BLm. For example, the bit line select signals LY1 and LYm may be generated from the column decoder 150 based on the column address Y_ADDR.

The sense amplification block 121 may include at least two sense amplifiers (i.e., the first sense amplifier 121a and the second sense amplifier 121b) respectively corresponding to the lower layer and the upper layer. The first sense amplifier 121a may be connected to the lower word line WL11 selected from among the lower word lines WL11 to WL1n, and the second sense amplifier 121b may be connected to the upper word line WL21 selected from among the upper word lines WL21 to WL2n. The first sense amplifier 121a may include a first sense amplifier SA1 and a pre-charge transistor TR1, and the second sense amplifier 121b may include a second sense amplifier SA2 and a pre-charge transistor TR2. The first sense amplifier 121a and the second sense amplifier 121b may have the same structure. The first sense amplifier 121a may be optimized for sensing the data of memory cells connected to the lower word lines WL11 to WL1n, and the second sense amplifier 121b may be optimized for sensing the data of memory cells connected to the upper word lines WL21 to WL2n. However, the inventive concept is not limited thereto, and the sense amplification block 121 may further include a third sense amplifier 121c and a fourth sense amplifier 121d. The third sense amplifier 121c may be connected to the lower word line WL1n selected from among the lower word lines WL11 to WL1n, and the fourth sense amplifier 121d may be connected to the upper word line WL2n selected from the upper word lines WL21 to WL2n.

A group including memory cells connected to the first and second sense amplifiers 121a and 121b may be referred to as a first sense amplifier group, and a group including memory cells connected to the third and fourth sense amplifiers 121c and 121d may be referred to as a second sense amplifier group. In this case, the first sense amplifier group may be connected to first and second global word lines or first and second data lines DL1 and DL2, and the second sense amplifier group may be connected to third and fourth global word lines or third and fourth data lines DL3 and DL4. Accordingly, lower word lines included in the first sense amplifier group from among the lower word lines WL11 to WL1n may be selected by the first data line DL1, and lower word lines included in the second sense amplifier group from among the lower word lines WL11 to WL1n may be selected by the third data line DL3. Similarly, upper word lines included in the first sense amplifier group from among the upper word lines WL21 to WL2n may be selected by the second data line DL2, and upper word lines included in the second sense amplifier group from among the upper word lines WL21 to WL2n may be selected by the fourth data line DL4.

Figure 4:
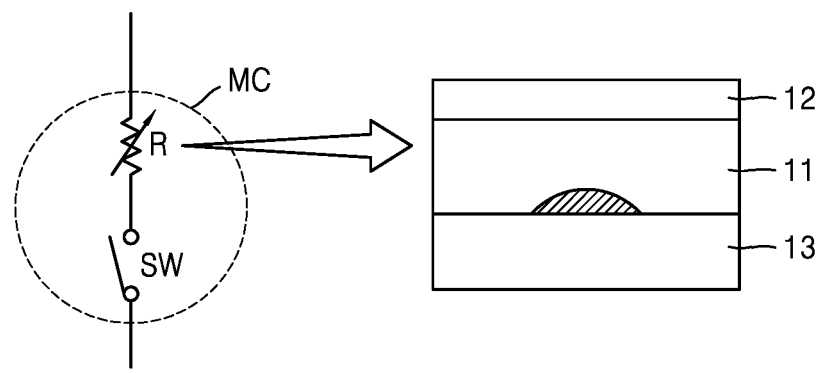
FIG. 4 illustrates a memory cell according to an embodiment of the inventive concept.

FIG. 4 illustrates a memory cell MC according to an embodiment of the inventive concept.

Referring to FIG. 4, the memory cell MC may include a variable resistor element R and a switching element (or referred to as "selection element") SW connected in series. The memory cell MC may correspond to one of the plurality of first memory cells MC1 and the plurality of second memory cells MC2 in FIG. 3. The variable resistor element R may include a phase change layer 11 (or a variable resistance layer), an upper electrode 12 formed on the phase change layer 11, and a lower electrode 13 formed below the bottom of the phase change layer 11. For example, the variable resistor element R may include a phase change material (e.g., Ge—Sb—Te (GST)), a transition metal oxide, or a magnetic material. The switching element SW may be implemented using various elements such as an Ovonic threshold switching (OTS) material, a transistor, and a diode.

The upper and lower electrodes 12 and 13 may include various metals, metal oxides, or metal nitrides. The phase change layer 11 may include a bipolar resistance memory material or a unipolar resistance memory material. The bipolar resistance memory material may be programmed to a set or reset state by the polarity of a current, and perovskite-based materials may be used for the bipolar resistance memory material. The unipolar resistance memory material may be programmed to a set or reset state even with a current of the same polarity, and a transition metal oxide such as NiOx or TiOx may be used for the unipolar resistance memory material.

Figure 5A:
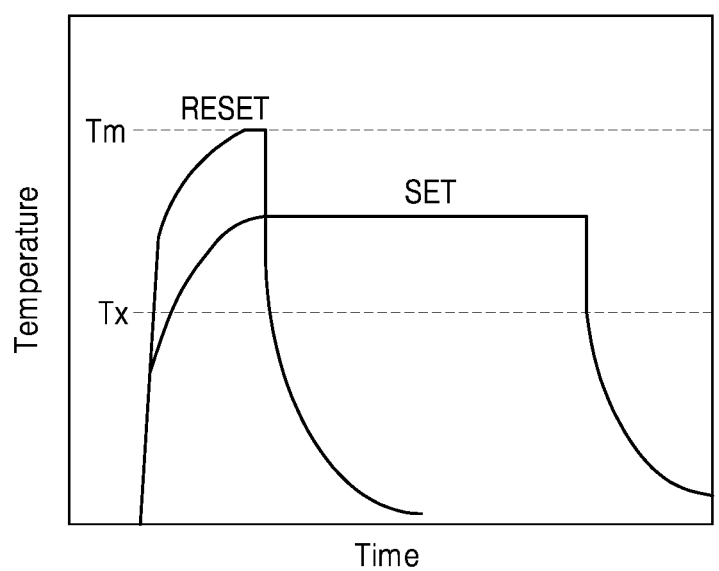
FIG. 5A is a graph showing set write and reset write for a variable resistor element of the memory cell of FIG. 4.
Figure 5B:
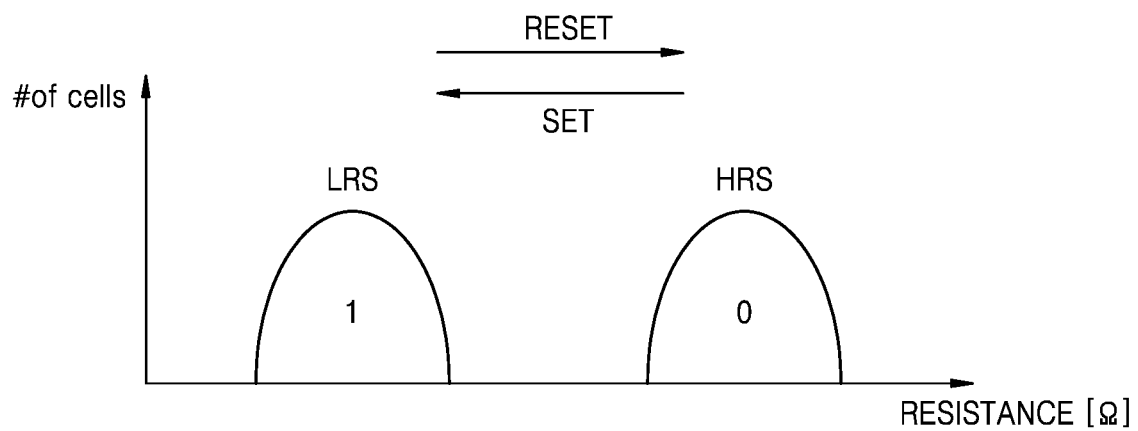
FIG. 5B is a graph showing the distribution of memory cells according to resistance when the memory cell of FIG. 4 is a single level cell.

FIG. 5A is a graph showing set write and reset write for the variable resistor element R of the memory cell MC of FIG. 4, and FIG. 5B is a graph showing the distribution of memory cells according to resistance when the memory cell MC of FIG. 4 is a single level cell.

Referring to FIGS. 4 and 5A together, when a phase change material constituting the variable resistor element R is heated to a temperature between a crystallization temperature Tx and a melting point Tm for a certain period of time and then gradually cooled, the phase change material is in a crystalline state. This crystalline state is referred to as a 'set state' in which data '0' is stored. On the other hand, when the phase change material is quenched after being heated to a temperature above the melting point Tm, the phase change material is in an amorphous state. This amorphous state is referred to as a 'reset state' in which data '1' is stored. Therefore, a current may be supplied to the variable resistor element R to store data, and the resistance value of the variable resistor element R may be measured to read data.

Referring to FIGS. 4 and 5B together, the horizontal axis of the graph of FIG. 5B represents resistance and the vertical axis of the graph of FIG. 5B represents the number of memory cells MC. When the memory cell MC is a single level cell, the memory cell MC may be in one of a low resistance state LRS, that is, a set state SET, and a high resistance state HRS, that is, a reset state RESET. Accordingly, the operation of switching the memory cell MC from the low resistance state LRS to the high resistance state HRS may be referred to as a reset operation or a reset write operation. In addition, the operation of switching the memory cell MC from the high resistance state HRS to the low resistance state LRS may be referred to as a set operation or a set write operation.

Figure 6A:
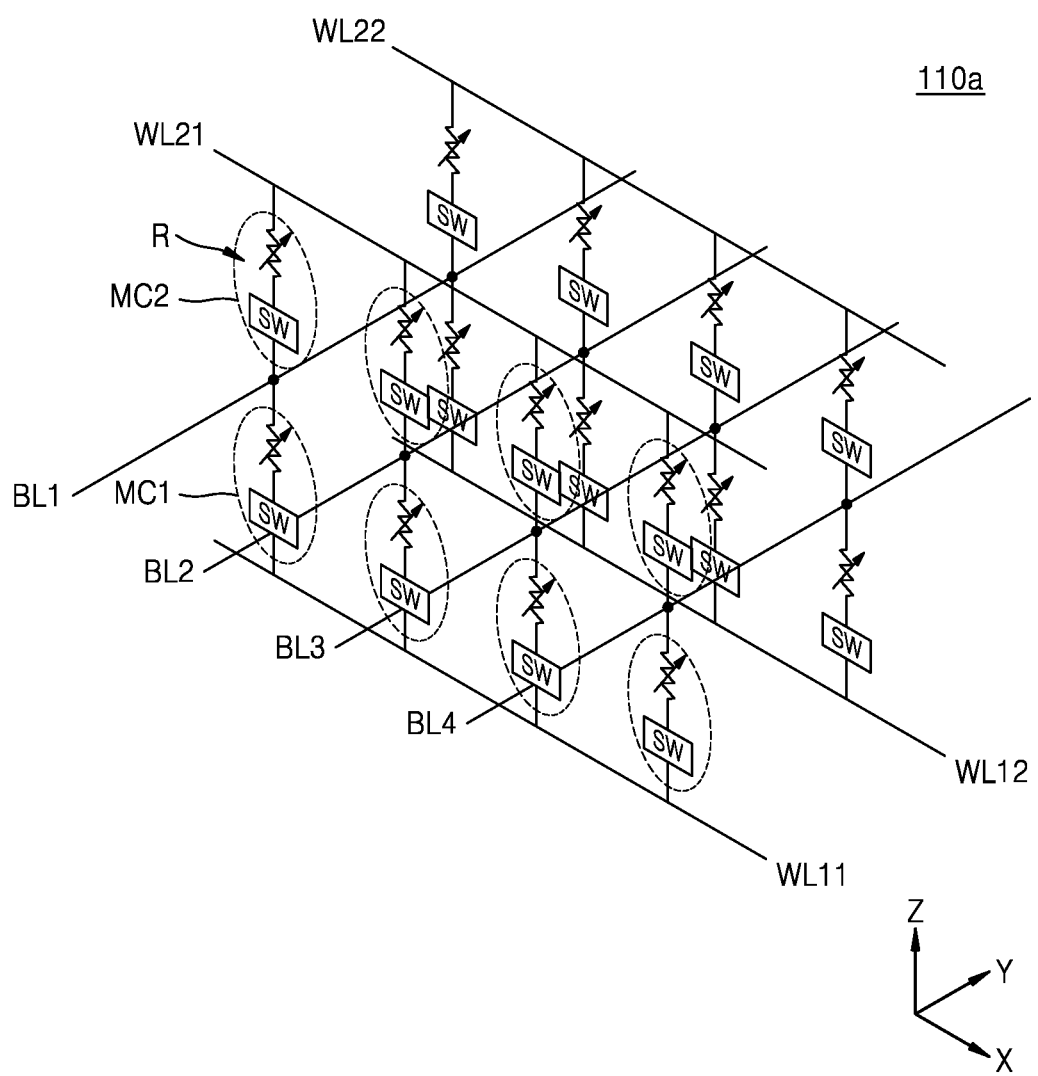
FIG. 6A is a circuit diagram of a memory cell array according to an embodiment of the inventive concept.

FIG. 6A is a circuit diagram of a memory cell array 110a according to an embodiment of the inventive concept.

Referring to FIG. 6A, the memory cell array 110a may include vertically stacked first and second layers, and the first and second layers may share signal lines, for example, bit lines BL1 to BL4. The memory cell array 110a may include lower word lines WL11 and WL12 extending in a first direction (X direction) and spaced apart from each other in a second direction (Y direction) perpendicular to the first direction, and upper word lines WL21 and WL22 extending in the first direction and spaced apart from the lower word lines WL11 and WL12 in a third direction (Z direction) perpendicular to the first direction. In addition, the memory cell array 110a may include the bit lines BL1 to BL4 separated from each of the upper word lines WL21 and WL22 and the lower word lines WL11 and WL12 in the third direction and extending in the second direction.

First memory cells MC1 may be respectively arranged in regions where the bit lines BL1 to BL4 intersect with the lower word lines WL11 and WL12, and second memory cells MC2 may be respectively arranged in regions where the bit lines BL1 to BL4 intersect with the upper word lines WL21 and WL22. The lower word lines WL11 and WL12, the first memory cells MC1, and the bit lines BL1 to BL4 may constitute the first layer, and the upper word lines WL21 and WL22, the second memory cells MC2, and the bit lines BL1 to BL4 may constitute the second layer. Arbitrary first and second memory cells MC1 and MC2 may be addressed by selectively activating the lower word lines WL11 and WL12, the upper word lines WL21 and WL22, and the bit lines BL1 to BL4. Each of the first and second memory cells MC1 and MC2 may include a variable resistor element R and a switching element SW.

In the case of the first layer, the variable resistor element R may be connected between one of the bit lines BL1 to BL4 and the switching element SW, and the switching element SW may be connected between the variable resistor element R and one of the lower word lines WL11 and WL12. In the case of the second layer, the variable resistor element R may be connected between one of the upper word lines WL21 and WL22 and the switching element SW, and the switching element SW may be connected between the variable resistor element R and one of the bit lines BL1 to BL4. However, the inventive concept is not limited thereto, and the arrangement order of the switching element SW and the variable resistor element R may be changed.

The switching element SW may control current supply to the variable resistor element R according to voltages applied to a word line and a bit line, which are connected to the switching element SW. For example, the switching element SW may be implemented with an Ovonic Threshold Switching (OTS) material. However, the inventive concept is not limited thereto, and in another embodiment, the switching element SW may be changed to other switchable elements such as a unidirectional diode, a bidirectional diode, and a transistor.

A voltage may be applied to the variable resistor element R of each of the first and second memory cells MC1 and MC2 through the lower word lines WL11 and WL12, the upper word lines WL21 and WL22, and the bit lines BL1 to BL4, and thus, a current may flow through the variable resistor element R. For example, the variable resistor element R may include a layer of phase change material that may reversibly transition between a first state and a second state. However, the variable resistor element R is not limited thereto and may include any variable resistor having a resistance value that varies depending on an applied voltage. For example, in each of the first and second memory cells MC1 and MC2, the resistance of the variable resistor element R may reversibly transition between the first state and the second state depending on a voltage applied to the variable resistor element R.

Figure 6B:
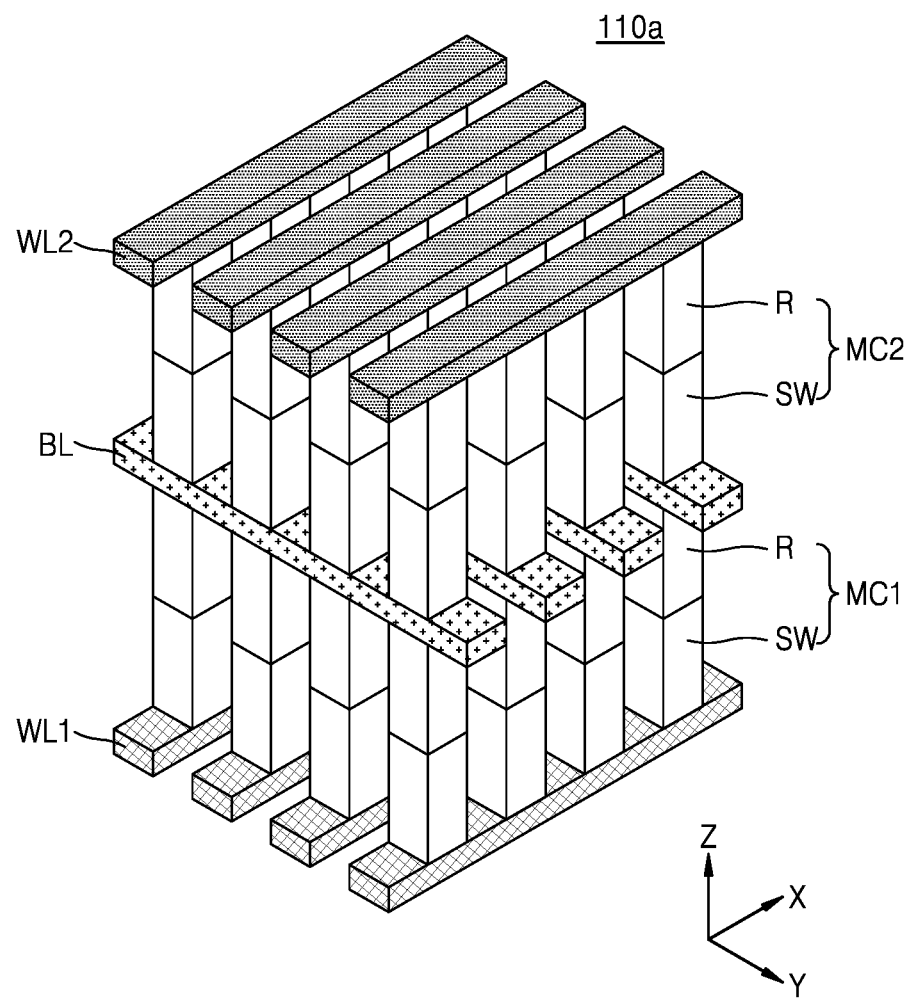
FIG. 6B is a perspective view of the memory cell array of FIG. 6A.

FIG. 6B is a perspective view of the memory cell array 110a of FIG. 6A according to an embodiment.

Referring to FIG. 6B, the memory cell array 110a may include lower word lines WL1, upper word lines WL2, bit lines BL, first memory cells MC1, and second memory cells MC2. The lower word lines WL1 may extend in a first direction X and may be arranged parallel to one another in a second direction Y. In this case, the first direction X and the second direction Y may be substantially orthogonal to each other. The bit lines BL may extend in the second direction Y and may be arranged parallel to one another in the first direction X. The upper word lines WL2 may extend in the first direction X and may be arranged parallel to one another in the second direction Y. The first memory cells MC1 may be respectively arranged in regions where the lower word lines WL1 intersect with the bit lines BL, and the second memory cells MC2 may be respectively arranged in regions where the upper word lines WL2 intersect with the bit lines BL.

Figure 7:
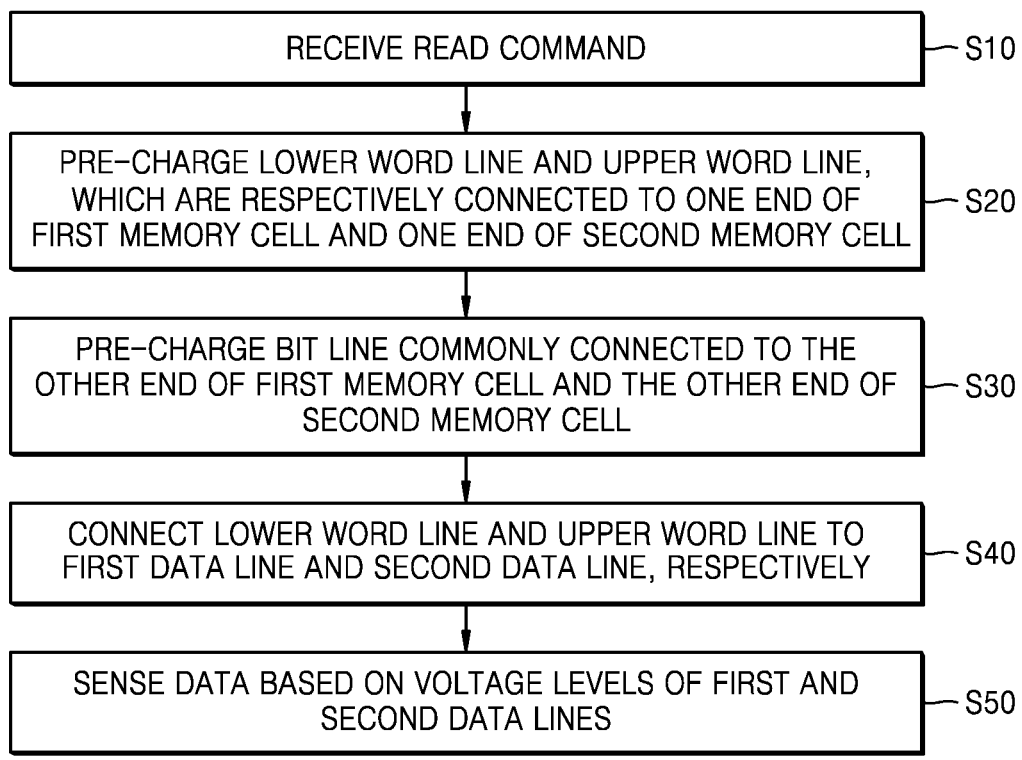
FIG. 7 is a flowchart of a method of reading data from a memory device, according to an embodiment of the inventive concept.

FIG. 7 is a flowchart of a method of reading data by a memory device, according to an embodiment of the inventive concept.

Referring to FIG. 7, the method according to the present embodiment corresponds to an operation of reading data by a memory device according to a request from a host. For example, the method may include operations performed in a time series in the memory device 100 of FIG. 1. For example, the memory controller 200 may provide a read command to the memory device 100 according to a request from the host. In Operation S10, the memory device 100 receives a read command, and decodes an address provided with the read command to determine selected memory cells. For example, the selected memory cells may be a first memory cell arranged in a first layer and a second memory cell arranged in a second layer.

In Operation S20, the memory device 100 pre-charges a lower word line and an upper word line, which are respectively connected to one end of the first memory cell and one end of the second memory cell. In Operation S30, the memory device 100 pre-charges a bit line commonly connected to the other end of the first memory cell and the other end of the second memory cell. In an embodiment, in Operation S30, the lower word line and the upper word line may be floated. For example, a certain word line may be floated when the word line select transistor TRx connected to the certain word line is turned off. However, the inventive concept is not limited thereto. In some embodiments, in Operation S30, at least one of row switches connected to the lower word line and the upper word line may be slightly turned on. Operations S20 and S30 will be described later with reference to FIG. 8.

In Operation S40, the memory device 100 may connect the lower word line and the upper word line to a first data line and a second data line, respectively. For example, when the lower word line and the first data line are electrically connected to each other, charge sharing may be performed between the lower word line and the first data line and voltage levels of the lower word line and the first data line may be equal to each other. Accordingly, when the first memory cell is in a set state, the voltage level of the first data line may be relatively high, and when the first memory cell is in a reset state, the voltage level of the first data line may be relatively low.

In Operation S50, the memory device 100 may sense data, that is, data stored in the first and second memory cells, respectively, based on the voltage levels of the first and second data lines. The memory device 100 may compare the voltage level of the first data line with a reference voltage and output a comparison result as first data. In this case, the reference voltage may be set to an intermediate level between the voltage level of the first data line when the first memory cell is in the set state and the voltage level of the first data line when the first memory cell is in the reset state. Therefore, by comparing the voltage level of the first data line with the reference voltage, a comparison result may be output as 1-bit data, for example, 0 or 1. However, the inventive concept is not limited thereto. For example, when the first and second memory cells are multi-level cells, each of the first and second memory cells may have a plurality of states, and in Operation S50, voltage levels of the first and second data lines according to the plurality of states of the first and second memory cells may be determined. The memory device may read multi-bit data by comparing the voltage levels of the first and second data lines with a plurality of reference voltages, respectively.

Figure 8:
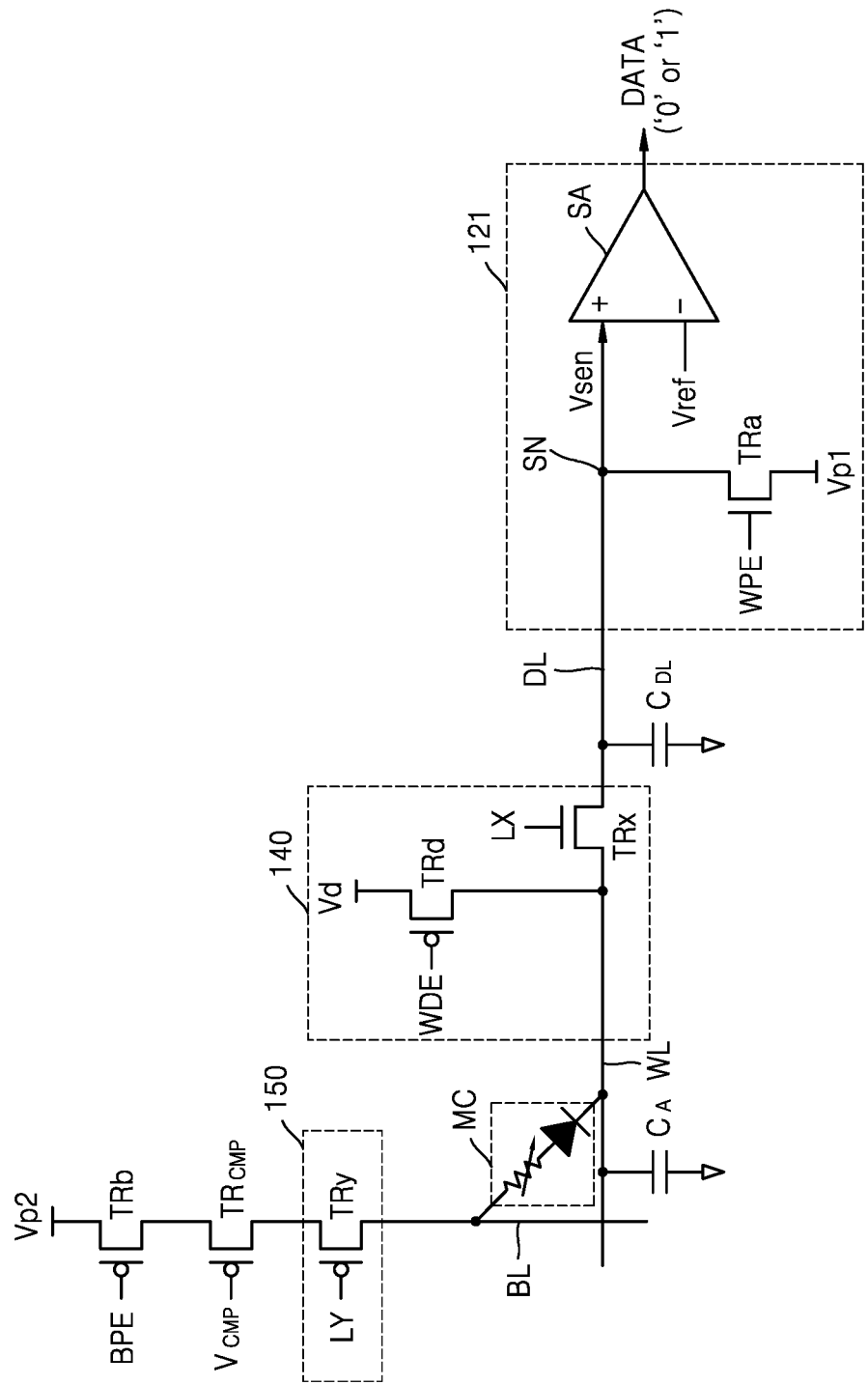
FIG. 8 is a circuit diagram illustrating components for performing a read operation of a memory device according to an embodiment of the inventive concept.

FIG. 8 is a circuit diagram illustrating components for performing a read operation of a memory device according to an embodiment of the inventive concept.

Referring to FIG. 8, a word line WL may be connected to one end of a memory cell MC, and a bit line BL may be connected to the other end of the memory cell MC. A row decoder 140 may be connected to the word line WL. For example, the row decoder 140 may include a plurality of row switches, such as a word line select transistor TRx and a discharge transistor TRd. In FIG. 8, the row decoder 140 is illustrated as including one word line select transistor TRx and one discharge transistor TRd for convenience of description. However, the row decoder 140 may include a plurality of word line select transistors TRx and a plurality of discharge transistors TRd, which are connected to a plurality of word lines. In addition, the row decoder 140 may further include other switches and/or control elements.

The word line select transistor TRx may be turned on or off in response to a word line select signal LX. The word line select signal LX may be generated from the row decoder 140 based on the row address X_ADDR. When the word line select transistor TRx is turned on, the word line WL may be connected to a sense amplification block 121 through a data line DL. The sense amplification block 121 may correspond to, for example, one of the first to fourth sense amplifiers 121a to 121d of FIG. 3. When the word line select transistor TRx is implemented as an NMOS transistor, the word line select transistor TRx may be turned on when the word line select signal LX is at a high level and may be turned off when the word line select signal LX is at a low level.

The discharge transistor TRd may be turned on or off in response to a discharge enable signal WDE. When the discharge transistor TRd is turned on, a discharge voltage Vd may be applied to the word line WL. For example, the discharge voltage Vd may be a ground voltage VSS. In an embodiment, the discharge transistor TRd may be implemented as an NMOS transistor. The discharge transistor TRd of NMOS transistor may be turned on when the discharge enable signal WDE is at a high level and may be turned off when the discharge enable signal WDE is at a low level. In an embodiment, the discharge transistor TRd may be implemented as a PMOS transistor. The discharge transistor TRd of PMOS transistor may be turned on when the discharge enable signal WDE is at a low level and may be turned off when the discharge enable signal WDE is at a high level. For example, in a read operation, when a word line select transistor TRx connected to a selected word line is turned on, a discharge transistor TRd connected to the selected word line may be turned off. Discharge transistors TRd connected to unselected word lines may be turned on, and word line select transistors TRx connected to the unselected word lines may be turned off.

A column decoder 150 may be connected to the bit line BL. For example, the column decoder 150 may include a plurality of column switches, such as a bit line select transistor TRy. In FIG. 8, the column decoder 150 is illustrated as including one bit line select transistor TRy for convenience of description. However, the column decoder 150 may include a plurality of bit line select transistors TRy respectively connected to a plurality of bit lines BL. Also, the column decoder 150 may further include a plurality of discharge transistors respectively connected to the plurality of bit lines BL.

The bit line select transistor TRy may be connected to control switches, for example, a clamping transistor $TR_{CMP}$ and a bit line pre-charge transistor TRb. The bit line pre-charge transistor TRb and the clamping transistor $TR_{CMP}$ may be understood as components of the sense amplification block 121. The bit line select transistor TRy is turned on or off in response to a bit line select signal LY. The bit line select signal LY may be generated from the column decoder 150 based on the column address Y_ADDR. For example, when the bit line select transistor TRy is implemented as a PMOS transistor, the bit line select transistor TRy may be turned on when the bit line select signal LY is at a low level, and turned off when the bit line select signal LY is at a high level. The bit line pre-charge transistor TRb may be turned on or off in response to a bit line pre-charge enable signal BPE. For example, when the bit line pre-charge transistor TRb is implemented as a PMOS transistor, the bit line pre-charge transistor TRb may be turned on when the bit line pre-charge enable signal BPE is at a low level, and turned off when the bit line pre-charge enable signal BPE is at a high level. When the bit line pre-charge transistor TRb is turned on, a second pre-charge voltage Vp2 may be applied to the bit line BL. In this case, the clamping transistor $TR_{CMP}$ may be controlled to apply a certain voltage to the bit line BL based on a clamping voltage $V_{CMP}$. In an embodiment, the clamping transistor $TR_{CMP}$ may be a PMOS transistor or an NMOS transistor. For example, the clamping transistor $TR_{CMP}$ of NMOS transistor may be turned on when the clamping voltage $V_{CMP}$ is at a high level, and turned off when the clamping voltage $V_{CMP}$ is at a low level. In this case, a voltage level of the clamping voltage $V_{CMP}$ may be greater than a voltage level of the bit line BL.

The sense amplification block 121 may include a word line pre-charge transistor TRa and a sense amplifier SA. The word line pre-charge transistor TRa may be turned on or off in response to a word line pre-charge enable signal WPE. In example embodiments, the word line pre-charge transistor TRa may be implemented as a PMOS transistor. The PMOS transistor of the word line pre-charge transistor TRa may be turned on when the word line pre-charge enable signal WPE is at a low level, and turned off when the word line pre-charge enable signal WPE is at a high level. In example embodiments, the word line pre-charge transistor TRa may be implemented as an NMOS transistor. The NMOS transistor of the word line pre-charge transistor TRa may be turned on when the word line pre-charge enable signal WPE is at a high level, and turned off when the word line pre-charge enable signal WPE is at a low level. When the word line select transistor TRx and the word line pre-charge transistor TRa are turned, a first pre-charge voltage Vp1 may be applied to the word line WL. In an embodiment, a voltage level of a pre-charge voltage applied to the lower word line may be different from a voltage level of a pre-charge voltage applied to the upper word line. However, the inventive concept is not limited thereto, and the voltage level of the pre-charge voltage applied to the lower word line may be the same as the voltage level of the pre-charge voltage applied to the upper word line The word line WL and the bit line BL may each include a parasitic capacitor, and the capacitance of the parasitic capacitor of the word line WL, for example, a word line capacitor $C_A$, may be less than that of the parasitic capacitor (not shown) of the bit line BL. Accordingly, the sense amplifier SA may be connected to the word line WL having relatively small influence by the parasitic capacitor and sense the voltage level of the word line WL, thereby reading data of a selected memory cell MC.

The sense amplifier SA may compare a sensing voltage Vsen of a sensing node SN, for example, a voltage level of the data line DL (in this case, the voltage level of the data line DL is the same as the voltage level of the word line WL), with a reference voltage Vref and output a comparison result as data DATA. For example, the sense amplifier SA may operate as a comparator. When the memory cell MC is in a set state, the sensing voltage Vsen may be higher than the reference voltage Vref, and the sense amplifier SA may output '1' as the data DATA. When the memory cell MC is in a reset state, the sensing voltage Vsen may be lower than the reference voltage Vref, and the sense amplifier SA may output '0' as the data DATA.

Hereinafter, the read operation of the memory device will be described with reference to FIGS. 7 and 8. In Operation S20, the word line select transistor TRx may be turned on to connect the word line WL to the data line DL, and the word line WL and the data line DL may be pre-charged through a pre-charge path connected to the data line DL. In Operation S30, the bit line select transistor TRy may be turned on and thus the bit line BL may be pre-charged.

The second pre-charge voltage Vp2 may be higher than the first pre-charge voltage Vp1, and a difference between the first pre-charge voltage Vp1 and the second pre-charge voltage Vp2 may be greater than a threshold voltage of the memory cell MC, for example, a threshold voltage of the switching element SW. Accordingly, a current (hereinafter referred to as "cell current") may flow through the memory cell MC and the cell current may charge the word line WL, and thus, the voltage level of the word line WL may increase. In this case, because the amount of cell current varies according to the state of the memory cell MC, for example, according to the set state or the reset state, the voltage level of the word line WL may be changed according to the state of the memory cell MC. For example, when the memory cell MC is in the set state, the voltage level of the word line WL may increase relatively large because the resistance value of the memory cell MC is relatively small and the amount of cell current is relatively large. On the other hand, when the memory cell MC is in the reset state, the voltage level of the word line WL may increase relatively small or not increase because the resistance value of the memory cell MC is relatively large and the amount of cell current is relatively small, FIG. 9 is a graph showing a read operation of a memory device according to an embodiment of the inventive concept.

Figure 9:
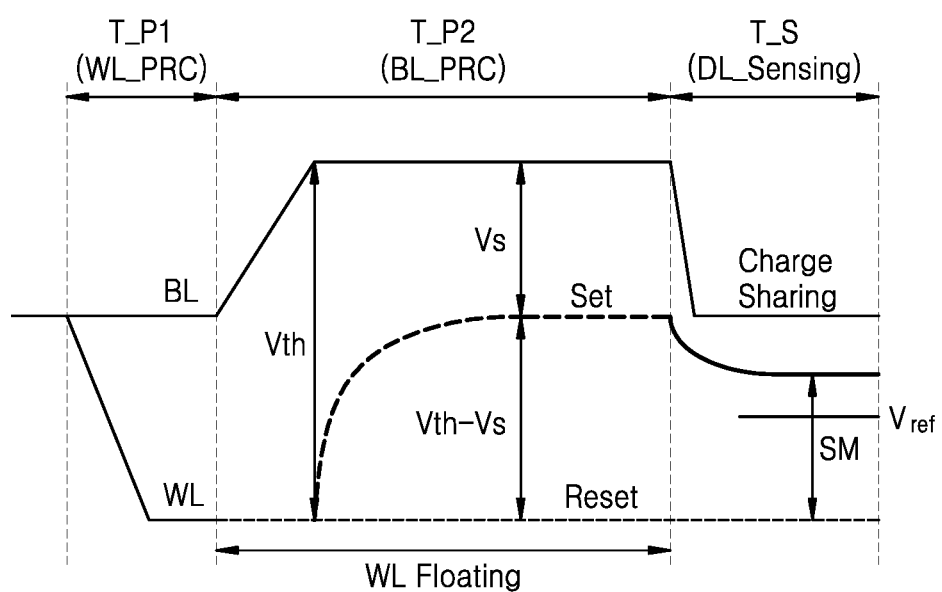
FIG. 9 is a graph showing a read operation of a memory device according to an embodiment of the inventive concept.

Referring to FIGS. 8 and 9 together, the horizontal axis of the graph of FIG. 9 represents time and the vertical axis of the graph of FIG. 9 represents voltage levels of the bit line BL and the word lines WL. The memory device may pre-charge the word line WL to the first pre-charge voltage Vp1 in a first pre-charge period T_P1, for example, a word line pre-charge period WL_PRC. When the word line select transistor TRx and the word line pre-charge transistor TRa are turned on, the word line WL and the data line DL may be pre-charged to the first pre-charge voltage Vp1. In an embodiment, the first pre-charge voltage Vp1 may be a negative voltage, and the voltage level of the word line WL may drop to the first pre-charge voltage Vp1. In this case, the bit line select transistor TRy may be turned off, and thus, the bit line BL may be in a floating state. When the memory cell MC is a selected memory cell, the discharge transistor TRd may maintain a turn-off state during a read operation.

The word line WL may be floated in a second pre-charge period T_P2, for example, a bit line pre-charge period BL_PRC, and the bit line BL may be pre-charged to the second pre-charge voltage Vp2. For example, the word line WL may be floated when the word line select transistor TRx and the discharge transistor TRd both connected to the word line WL are turned off. The bit line select transistor TRy and the bit line pre-charge transistor TRb may be turned on in the second pre-charge period T_P2, and thus, the second pre-charge voltage Vp2 may be applied to the bit line BL. In an embodiment, a power supply voltage may be applied through the bit line pre-charge transistor TRb, and the clamping transistor $TR_{CMP}$ may maintain the voltage level of the bit line BL as the second pre-charge voltage Vp2 according to the clamping voltage $V_{CMP}$.

In the second pre-charge period T_P2, the voltage level of the bit line BL may increase to the second pre-charge voltage Vp2. In this case, when a difference between the voltage level of the bit line BL and the voltage level of the word line WL is equal to or greater than a threshold voltage Vth of the memory cell MC, a cell current may flow in the memory cell MC. When the memory cell MC is in the set state, the voltage level of the word line WL may increase, and the difference between the voltage level of the word line WL and the voltage level of the bit line BL may be maintained above a blocking voltage Vs (i.e., a voltage level at which the cell current of the memory cell MC is blocked). Accordingly, when the memory cell MC is in the set state, the voltage level of the word line WL may increase up to a voltage level obtained by reducing the voltage level of the bit line BL by the blocking voltage Vs. On the other hand, when the memory cell MC is in the reset state, the voltage level of the word line WL may hardly increase or may increase very small.

In some embodiments, in the second pre-charge period T_P2, the bit line BL may be pre-charged to the second pre-charge voltage Vp2 while the word line select transistor TRx is slightly turned on. In this case, as the word line select transistor TRx is slightly turned on, the word line WL may be pseudo-floated. For example, when the word line select signal LX has a certain voltage level between a voltage level of the high level and a voltage level of the low level, the word line select transistor TRx may be slightly turned on. Thus, when the selected memory cell is in a set state, the data line DL is slightly charged in the second pre-charge period T_P2. As described above, the word line select transistor TRx may be turned on when the word line select signal LX is at a high level, and may be turned off when the word line select signal LX is at a low level.

The word line select transistor TRx may be turned on in a sensing period T_S (for example, a data sensing period DL_Sensing), and thus, the word line WL and the data line DL may be electrically connected to each other and charge sharing may be performed. In an embodiment, the bit line BL may be discharged to a certain voltage, for example, a ground voltage VSS in a bit line discharge period (not shown) between the second pre-charge period T_P2 and the sensing period T_S. For example, a bit line discharge circuit connected to the bit line BL may discharge a voltage of the bit line BL during the bit line discharge period. The charge sharing may be performed after the bit line discharge period in the sensing period T_S. The voltage level of the word line WL may be the same as the voltage level of the data line DL by the charge sharing, and the voltage level of the word line WL may be changed as shown in FIG. 9. When the charge sharing is completed, data may be sensed based on the voltage level of the data line DL, for example, the sensing voltage Vsen. The sense amplifier SA may sense data by comparing the reference voltage Vref with the sensing voltage Vsen.

In the process of charge sharing, especially when the memory cell MC is in the set state, the voltage level of the word line WL may be reduced by the charge sharing. In this case, when the amount of reduction is large, the sensing margin of the sense amplifier SA may be reduced. However, because the word line select transistor TRx is slightly turned on in the second pre-charge period T_P2 and thus the data line DL is charged by a leakage current of the word line select transistor TRx, an effect such as an increase in the capacitance of the word line capacitor $C_A$ may occur. Accordingly, when the memory cell MC is in the set state, the amount of change in the voltage level of the word line WL may decrease, thereby sufficiently securing the sensing margin SM.

Figure 10:
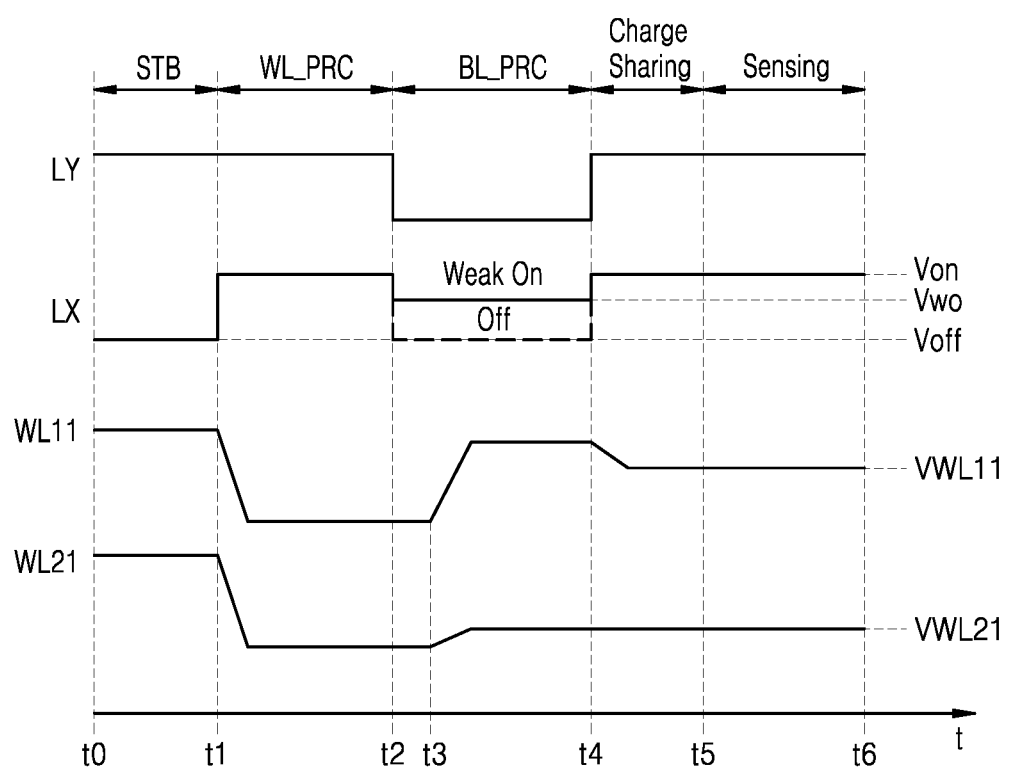
FIG. 10 is a timing diagram illustrating a read operation for first and second memory cells, according to an embodiment of the inventive concept.

FIG. 10 is a timing diagram illustrating a read operation for first and second memory cells MC1 and MC2, according to an embodiment of the inventive concept.

Referring to FIGS. 3, 6A and 8 to 10 together, the first and second memory cells MC1 and MC2 may share a bit line BL1, and the bit line BL1 may be driven by the bit line select signal LY. In addition, the first lower word line WL11 and the first upper word line WL21 connected to the first memory cell MC1 and the second memory cell MC2, respectively, may be driven by the same word line select signal LX. Accordingly, a read operation for the first memory cell MC1 and a read operation for the second memory cell MC2 may be performed in parallel and may be performed substantially simultaneously. Hereinafter, a word line select transistor connected to the first lower word line WL11 is referred to as a lower word line select transistor (e.g., a first row switch 711 in FIG. 22), and a word line select transistor connected to the first upper word line WL21 is referred to as an upper word line select transistor (e.g., a second row switch 721 in FIG. 22).

In a standby period STB from a time t0 to a time t1, the word line select signal LX may be at a low level, and the bit line select signal LY may be at a high level. Accordingly, the lower word line select transistor (e.g., a first row switch 711 in FIG. 22), the upper word line select transistor (e.g., a second row switch 721 in FIG. 22), and the bit line select transistor TRy may be turned off. The first lower word line WL11 and the first upper word line WL21 may be floated or have a voltage level of a ground voltage VSS. For example, the first lower word line WL11 and the first upper word line WL21 may have a ground voltage VSS by turning on the discharge transistor TRd of FIG. 8.

Thereafter, at the time t1, the word line select signal LX may transition to a high level, and the first lower word line WL11 and the first upper word line WL21 may be pre-charged based on the first pre-charge voltage Vp1. In this case, a period from the time t1 to a time t2 may be defined as a word line pre-charge period WL_PRC. The first pre-charge voltage Vp1 may be a negative voltage. Accordingly, a voltage level VWL11 of the first lower word line WL11 and a voltage level VWL21 of the first upper word line WL21 may drop. In an embodiment, the voltage level of a pre-charge voltage applied to the first lower word line WL11 and the voltage level of a pre-charge voltage applied to the first upper word line WL21 may be different from each other. However, the inventive concept is not limited thereto, and the voltage level of the pre-charge voltage applied to the lower word line WL11 may be the same as the voltage level of the pre-charge voltage applied to the upper word line WL21.

At the time t2, the bit line select signal LY may transition to a low level, and the bit line BL1 may be pre-charged based on the second pre-charge voltage Vp2. In this case, a period from the time t2 to a time t4 may be defined as a bit line pre-charge period BL_PRC. The second pre-charge voltage Vp2 may be higher than the first pre-charge voltage Vp1 and may be a positive voltage. In an embodiment, the word line select signal LX may transition to a low level, for example, an off level Voff, and accordingly, the first lower word line WL11 and the first upper word line WL21 may be floated. In an embodiment, the word line select signal LX may transition to a weak-on level Vwo, where the weak-on level Vwo may be higher than the low level (i.e., the off level Voff) of the word line select signal LX, and may be lower than the high level (i.e., an on level Von) of the word line select signal LX. The lower word line select transistor and the upper word line select transistor may be slightly turned on based on the word line select signal LX having the weak-on level Vwo, and accordingly, the first lower word line WL11 and the first upper word line WL21 may be pseudo-floated.

As described above, when a difference between the voltage level of the bit line BL1 and the voltage level of the first lower word line WL11 is equal to or greater than the threshold voltage of the first memory cell MC1 (e.g., at the time t3), a cell current may flow through the first memory cell MC1. Similarly, when a difference between the voltage level of the bit line BL1 and the voltage level of the first upper word line WL21 is equal to or higher than the threshold voltage of the second memory cell MC2 (e.g., at the time t3), a cell current may flow through the second memory cell MC2. For example, the first memory cell MC1 in the set state may have a greater amount of cell current than the second memory cell MC2 in the reset state, and as the cell current charges the parasitic capacitor CA of the first lower word line WL11, the voltage level VWL11 of the first lower word line WL11 may increase. In this case, when the lower word line select transistor is slightly turned on, the voltage level of the data line DL may rise as a leakage current of the lower word line select transistor charges a capacitor CDL of the data line DL. In the case of the second memory cell MC2 in the reset state, the voltage level VWL21 of the first upper word line WL21 may increase very small or may hardly increase.

At the time t4, as the bit line select signal LY and the word line select signal LX transitions to a high level and the bit line select transistor TRy is turned off and the lower word line select transistor is turned on, the first lower word line WL11 may be electrically connected to a first data line corresponding thereto, and thus, charge sharing may be performed between the first lower word line WL11 and the first data line DL1. Because the voltage level of the first data line DL1 is lower than the voltage level of the first lower word line WL11, the voltage level of the first lower word line WL11 decreases and the voltage level of the first data line DL1 increases, and thus, the voltage levels of the first lower word line WL11 and the first data line DL1 may be the same. Thereafter, data sensing for the first memory cell MC1 may be performed from a time t5 to a time t6, that is, in a data sensing period.

Similarly, at the time t4, as the word line select signal LX transitions to a high level and the upper word line select transistor is turned on, the first upper word line WL21 may be electrically connected to a second data line corresponding thereto, and thus, charge sharing may be performed between the first upper word line WL21 and the second data line DL2. Because the voltage level of the second data line DL2 is the same as the voltage level of the first upper word line WL21, the voltage level of the first upper word line WL21 may be maintained. Thereafter, data sensing for the second memory cell MC2 may be performed from the time t5 to the time t6, that is, in the data sensing period.

As described above, according to the present embodiment, a data read operation for the first memory cell MC1 and a data read operation for the second memory cell MC2 may be performed in parallel based on one word line select signal LX and one bit line select signal LY. Accordingly, a read speed for the first and second memory cells MC1 and MC2 may be improved, and the read power consumption of the memory device including the first and second memory cells MC1 and MC2 may be reduced.

Figure 11:
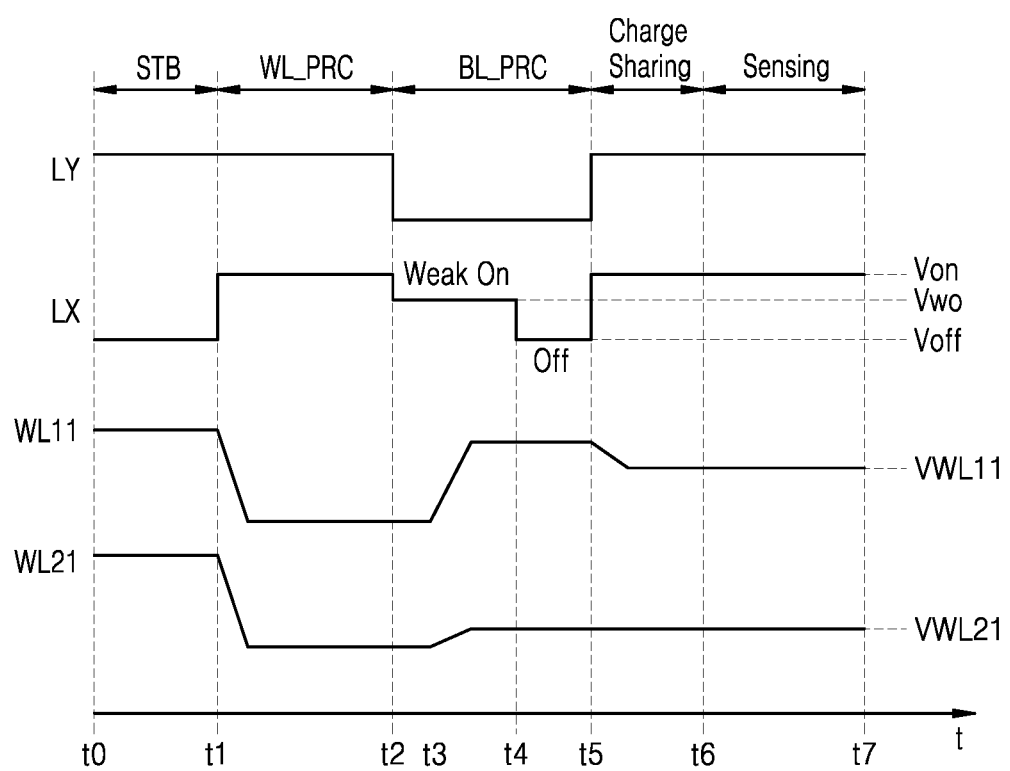
FIG. 11 is a timing diagram illustrating a read operation for first and second memory cells, according to an embodiment of the inventive concept.

FIG. 11 is a timing diagram illustrating a read operation for first and second memory cells MC1 and MC2, according to an embodiment of the inventive concept. Referring to FIG. 11, the read operation for the first and second memory cells MC1 and MC2 according to the present embodiment corresponds to a modification of the read operation illustrated in FIG. 10. When comparing the read operation according to the present embodiment with the read operation of FIG. 10, the voltage level of the word line select signal LX in the bit line pre-charge period BL_PRC according to the present embodiment may be different than that in the bit line pre-charge period BL_PRC according to the read operation of FIG. 10.

At a time t2, the bit line select signal LY may transition to a low level, and the bit line BL1 may be pre-charged based on the second pre-charge voltage Vp2. In addition, at the time t2, the word line select signal LX may transition to a weak-on level Vwo, and at a time t4, the word line select signal LX may transition to a low level Voff. Accordingly, the lower word line select transistor and the upper word line select transistor may be slightly turned on in a portion of the bit line pre-charge period BL_PRC and turned off in the remaining period. In this case, the period from the time t2 to the time t4 may be adjusted based on the capacitance of the word line capacitor $C_A$. For example, as the capacitance of the word line capacitor CA increases, the period in which the word line select transistor TRx is slightly turned on in the bit line pre-charge period BL_PRC may be reduced.

Figure 12:
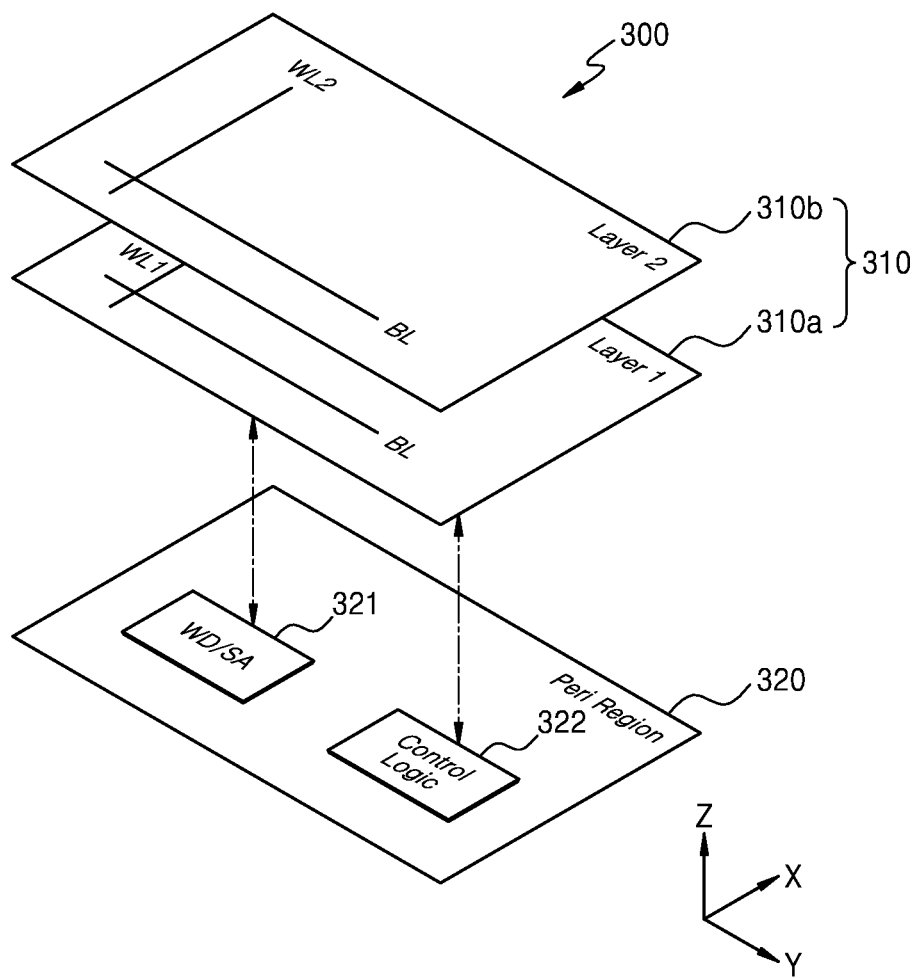
FIG. 12 illustrates a memory device having a cell over peripheral (COP) structure according to an embodiment of the inventive concept.

FIG. 12 illustrates a memory device 300 having a cell over peripheral (COP) structure according to an embodiment of the inventive concept.

Referring to FIG. 12, the memory device 300 may include first and second semiconductor layers 310 and 320 stacked in a vertical direction Z. The first semiconductor layer 310 may include first and second layers 310a and 310b. In some embodiments, the first semiconductor layer 310 may further include one or more layers on the second layer 310b. The first layer 310a may include lower word lines WL1, the second layer 310b may include upper word lines WL2, and the first layer 310a and the second layer 310b may share bit lines BL.

The first layer 310a may further include first memory cells respectively arranged in regions where the lower word lines WL1 intersect with the bit lines BL, and the second layer 310b may further include second memory cells respectively arranged in regions where the upper word lines WL2 intersect with the bit lines BL. A peripheral region including peripheral circuits may be arranged on and in the second semiconductor layer 320. For example, a write/read circuit (for example, a write driver/sensing amplifier WD/SA) 321 and a control logic 322 may be arranged on and in the second semiconductor layer 320. However, the inventive concept is not limited thereto, and various types of peripheral circuits related to memory operations may be arranged on and in the second semiconductor layer 320.

Figure 13:
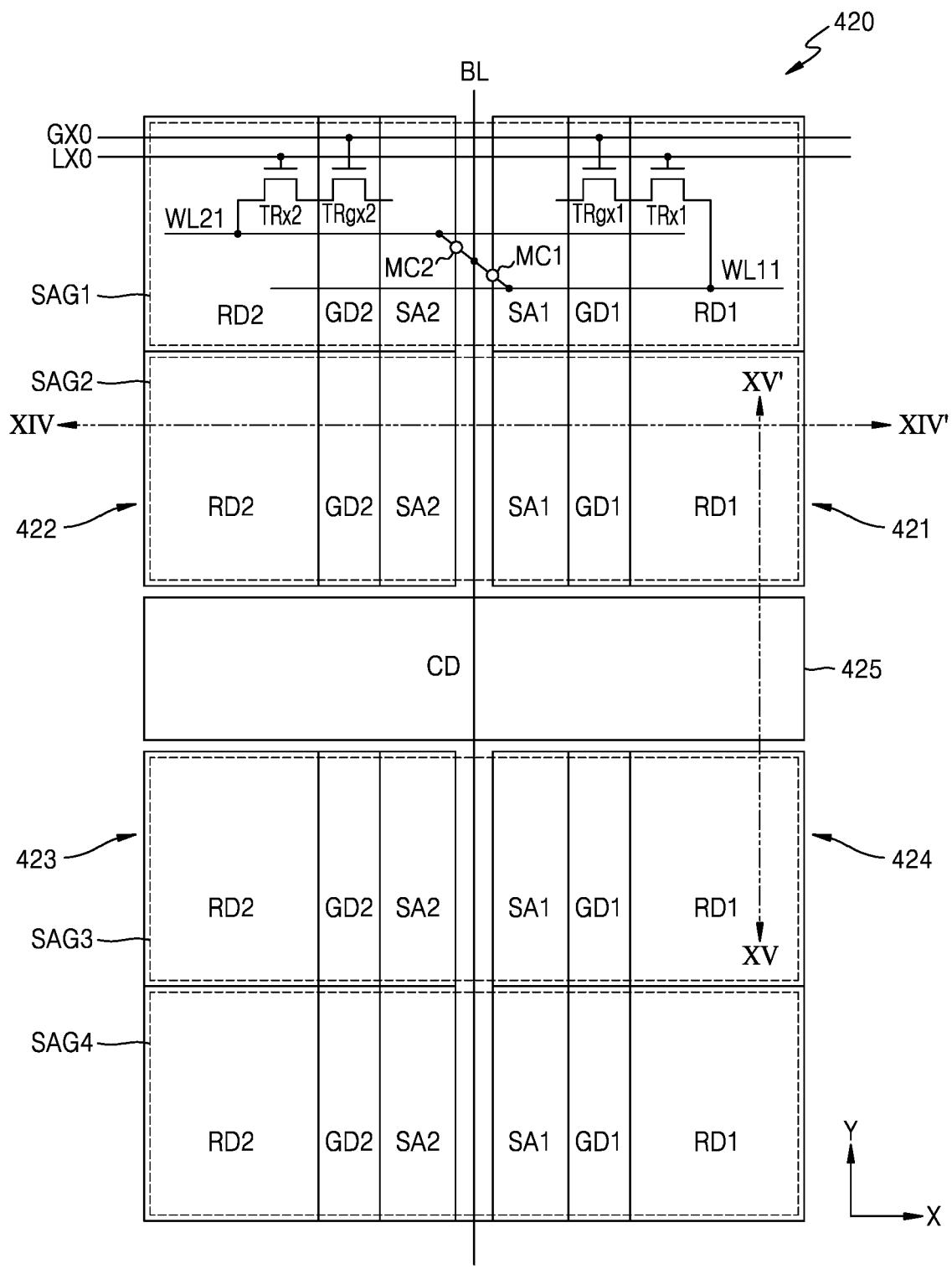
FIG. 13 illustrates a top surface of a second semiconductor layer, according to an embodiment of the inventive concept.
Figure 14:
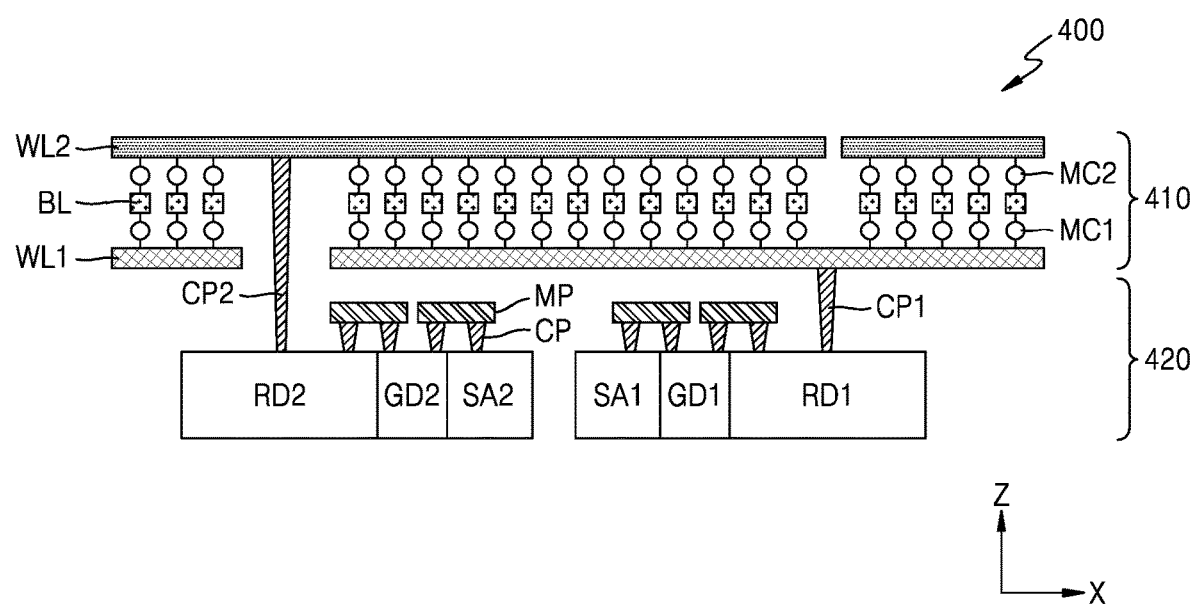
FIG. 14 is a cross-sectional view of a memory device taken along line XIV-XIV' in FIG. 13.

FIG. 13 illustrates a top surface of a second semiconductor layer 420 in a memory device 400 (see FIG. 14) having a COP structure, according to an embodiment of the inventive concept. FIG. 14 is a cross-sectional view of the memory device 400 taken along line XIV-XIV' in FIG. 13, and FIG. 15 is a cross-sectional view of the memory device 400 taken along line XV-XV' in FIG. 13.

Figure 15:
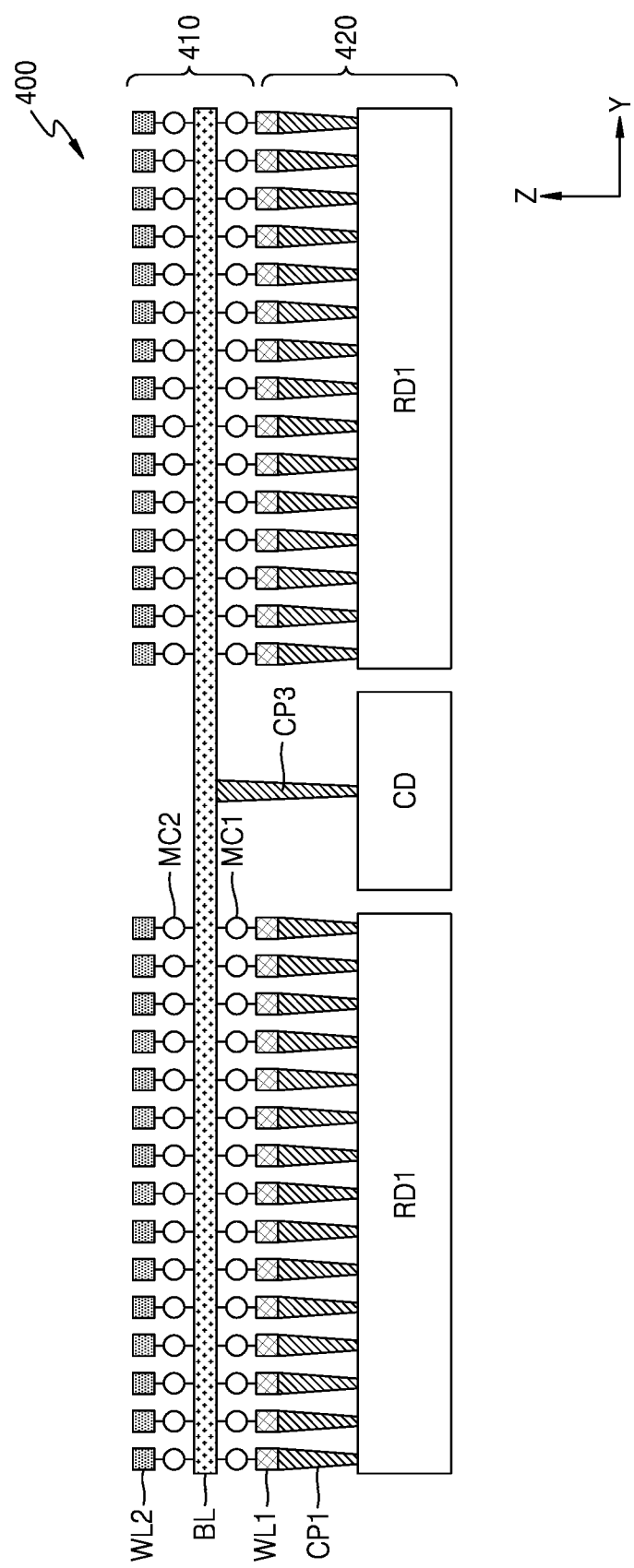
FIG. 15 is a cross-sectional view of the memory device taken along line XV-XV' in FIG. 13.

Referring to FIGS. 13 to 15 together, the memory device 400 having the COP structure may include first and second semiconductor layers 410 and 420, which are vertically stacked, and the top surface of the second semiconductor layer 420 may be divided into first to fifth regions 421 to 425. The first and second regions 421 and 422 may be adjacent to each other in the first direction X, and the third and fourth regions 423 and 424 may be adjacent to each other in the first direction X. The fifth region 425 may be arranged at a central portion of the upper surface of the second semiconductor layer 420, and a column decoder CD for driving a bit line BL may be arranged in the fifth region 425.

First row decoders RD1 for driving lower word lines WL1, first global decoders GD1 for driving global lower word lines connected to the lower word lines WL1, and lower sense amplifiers SA1 for sensing first memory cells MC1 may be arranged in the first and fourth regions 421 and 424. Second row decoders RD2 for driving upper word lines WL2, second global decoders GD2 for driving global upper word lines connected to the upper word lines WL2, and upper sense amplifiers SA2 for sensing second memory cells MC2 may be arranged in the second and third regions 422 and 423.

A first lower word line WL11 and a first upper word line WL21 may extend in the first direction X, and the bit line BL may extend in the second direction Y. Each of the first row decoders RD1 may include a first row switch TRx1, each of the first global decoders GD1 may include a first global switch TRgx1, each of the second row decoders RD2 may include a second row switch TRx2, and each of the second global decoders GD2 may include a second global switch TRgx2. In this case, the first and second row switches TRx1 and TRx2 may be driven by a word line select signal LX0, and the first and second global switches TRgx1 and TRgx2 may be driven by a global word line select signal GX0. Accordingly, read operations may be simultaneously performed on the first and second memory cells MC1 and MC2 connected to the bit line BL. As described above, memory cells, which are driven by the same word line select signal and the same global word line select signal and simultaneously read, may be defined as a sense amplifier group. For example, the memory device 400 may include first to fourth sense amplifier groups SAG1 to SAG4.

The first row decoder RD1 may be connected to the lower word line WL1 through a first contact plug CP1, and may be electrically connected to the first global decoder GD1 and the first sense amplifier SA1 through a contact plug CP and a metal pattern MP. The second row decoder RD2 may be connected to the upper word line WL2 through a second contact plug CP2, and may be electrically connected to the second global decoder GD2 and the second sense amplifier SA2 through a contact plug CP and a metal pattern MP. The column decoder CD may be connected to the bit line BL through a third contact plug CP3.

Figure 16:
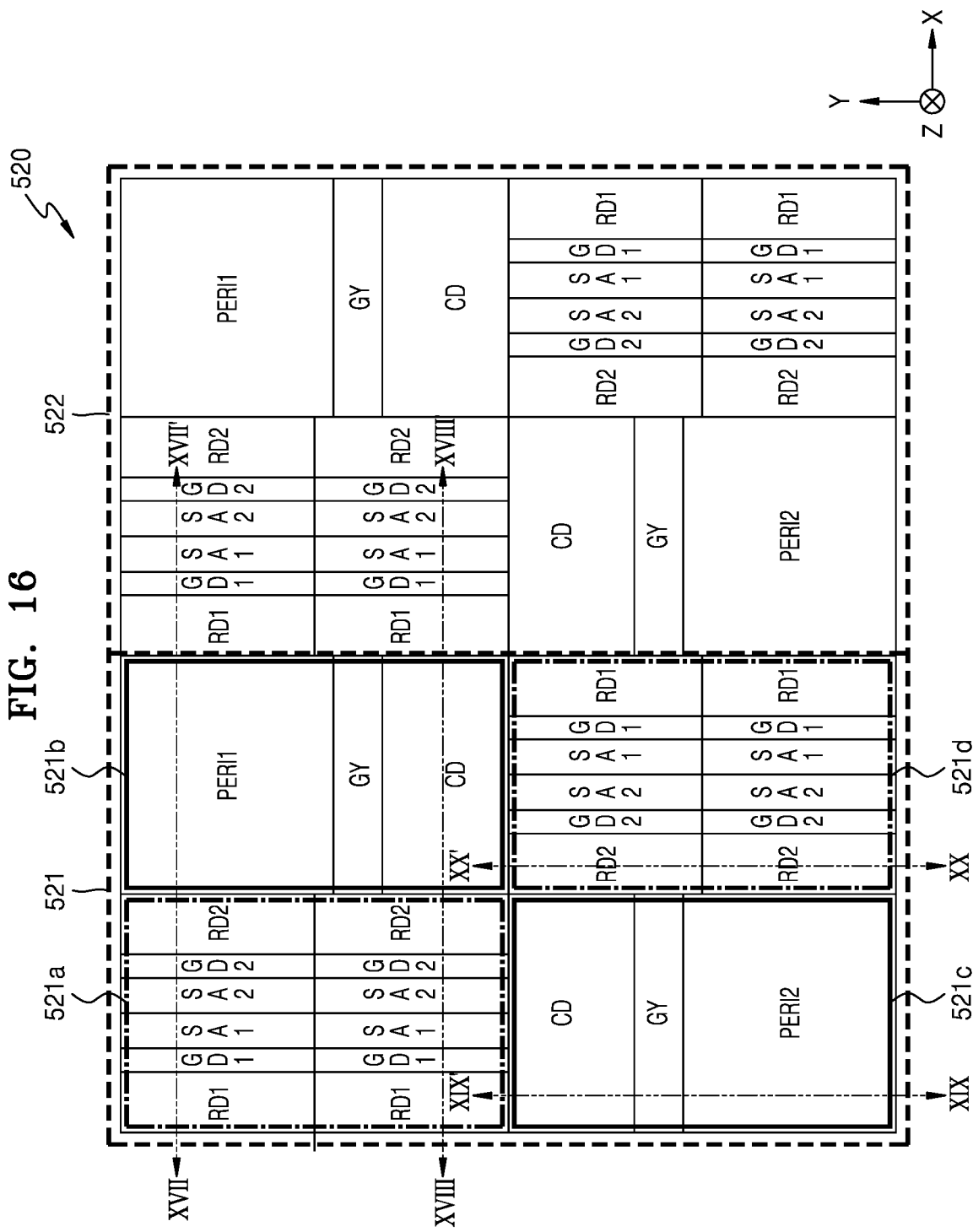
FIG. 16 illustrates a top surface of a second semiconductor layer, according to an embodiment of the inventive concept.
Figure 17:
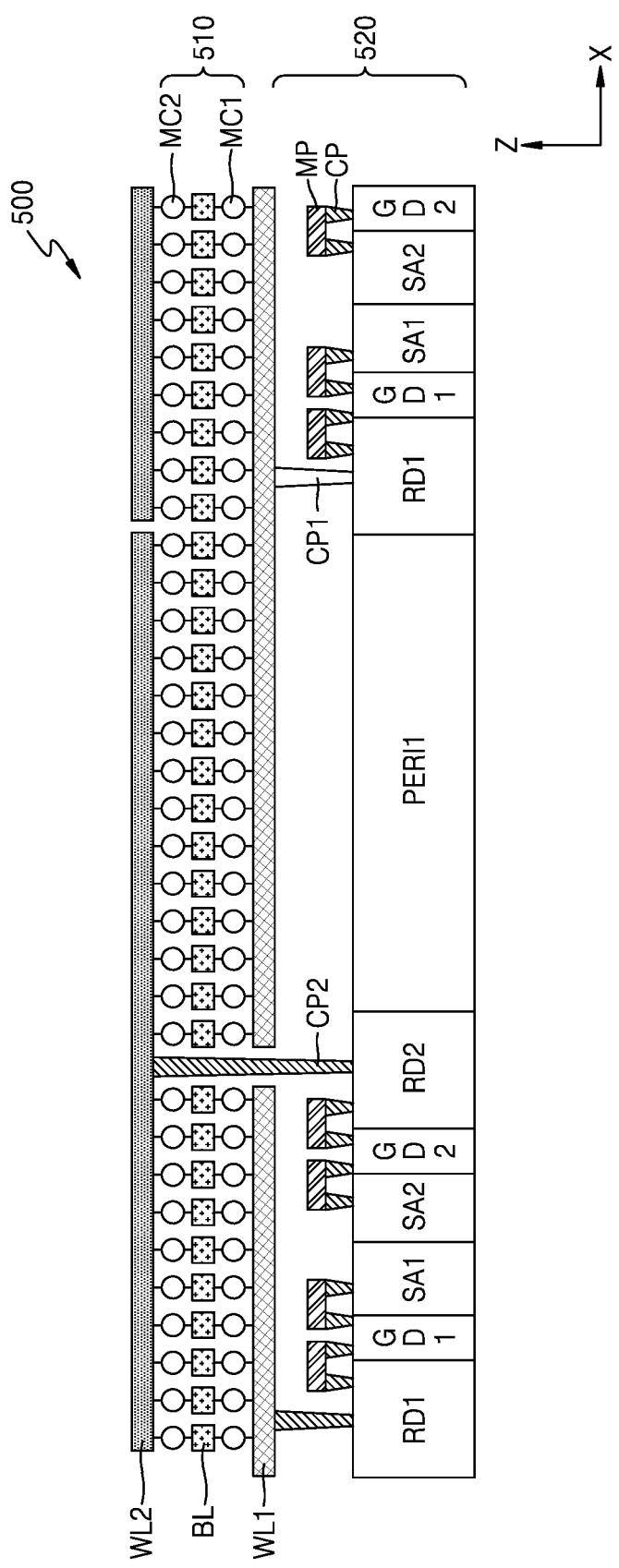
FIG. 17 is a cross-sectional view of a memory device taken along line XVII-XIVII' in FIG. 16.
Figure 18:
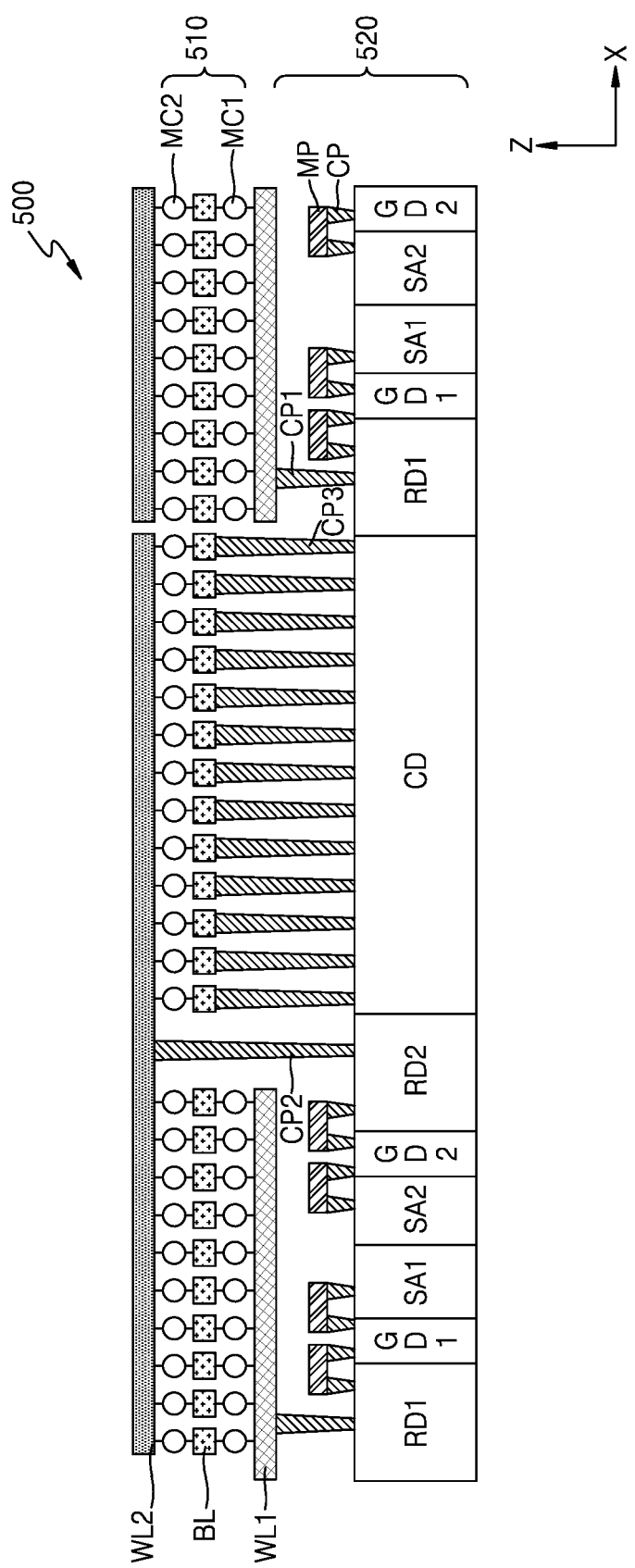
FIG. 18 is a cross-sectional view of the memory device taken along line XVIII-XVIII' in FIG. 16.
Figure 19:
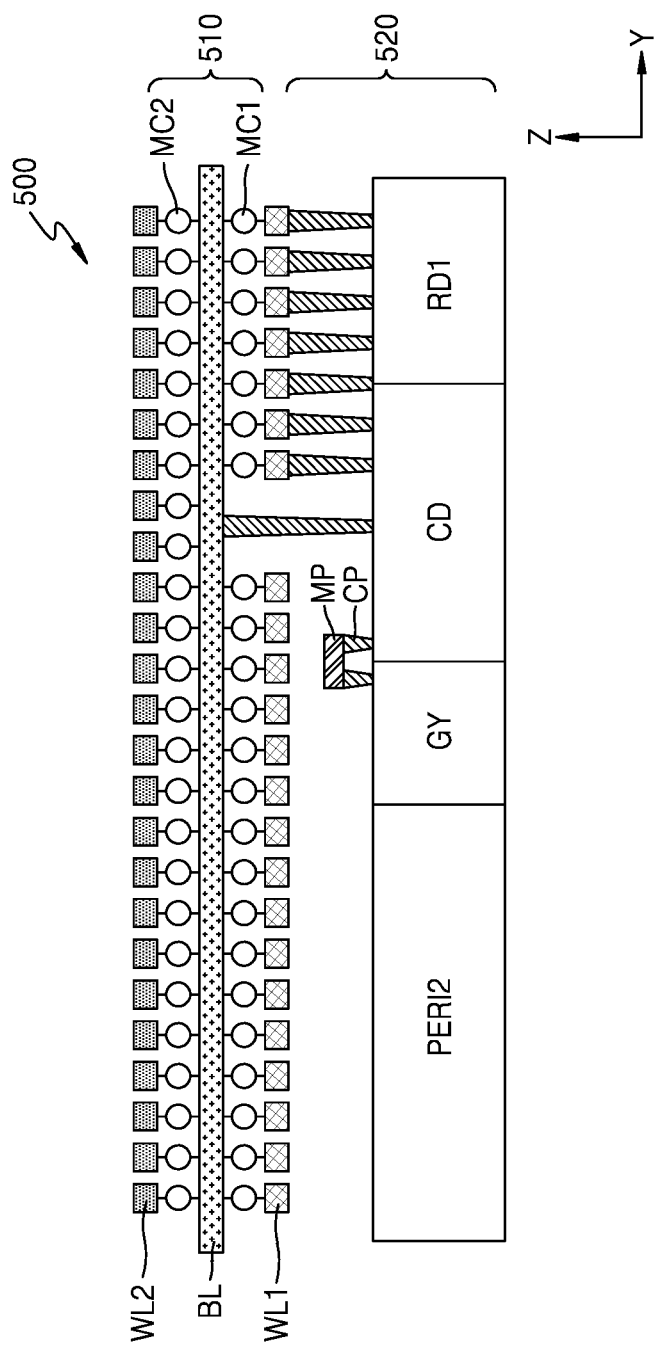
FIG. 19 is a cross-sectional view of the memory device taken along line XIX-XIX' in FIG. 16.
Figure 20:
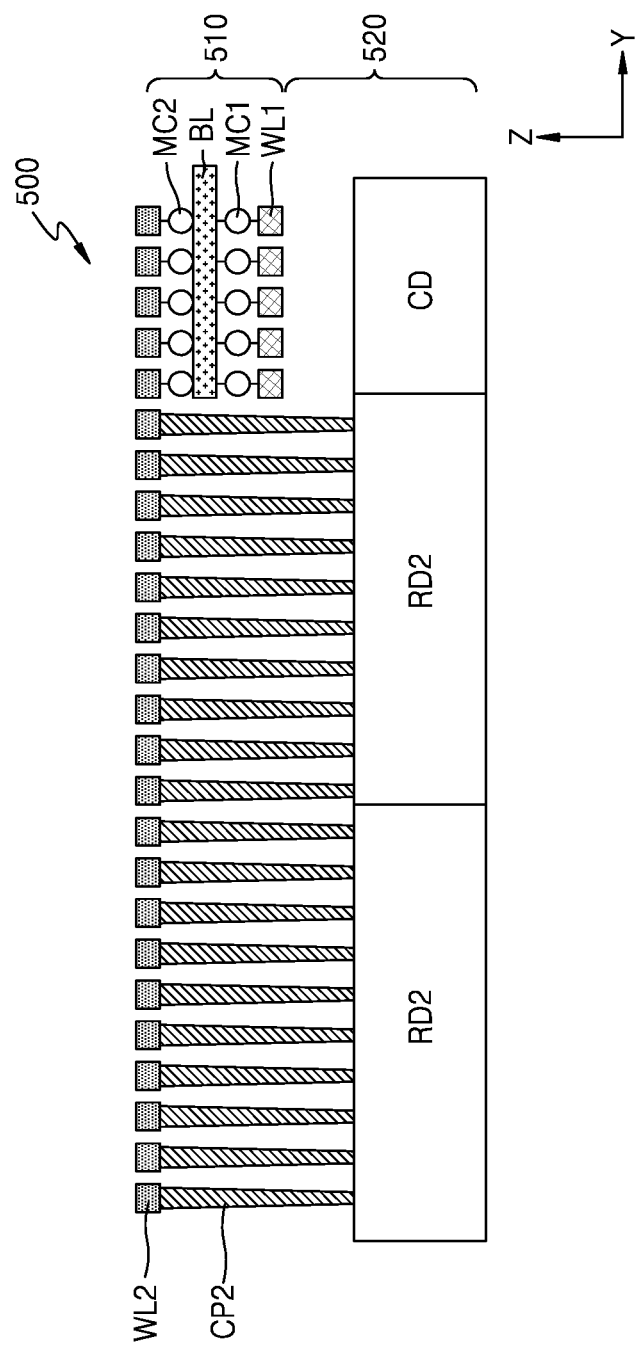
FIG. 20 is a cross-sectional view of the memory device taken along line XX-XX' in FIG. 16.

FIG. 16 illustrates a top surface of a second semiconductor layer 520 in a memory device 500 (see FIG. 17) having a COP structure, according to an embodiment of the inventive concept. FIG. 17 is a cross-sectional view of the memory device 500 taken along line XVII-XVII' in FIG. 16, FIG. 18 is a cross-sectional view of the memory device 500 taken along line XVIII-XVIII' in FIG. 16, FIG. 19 is a cross-sectional view of the memory device 500 taken along line XIX-XIX' in FIG. 16, and FIG. 20 is a cross-sectional view of the memory device 500 taken along line XX-XX' in FIG. 16.

Referring to FIGS. 16 to 20 together, the memory device 500 having the COP structure may include first and second semiconductor layers 510 and 520, which are vertically stacked, and the top surface of the second semiconductor layer 520 may be divided into a first tile region 521 and a second tile region 522. A first memory array, that is, a first tile, may be arranged on the top in a vertical direction Z with respect to the first tile region 521, and a second memory array, that is, a second tile, may be arranged on the top in the vertical direction Z with respect to the second tile region 522. Accordingly, the structure of the first tile region 521 may be substantially the same as the structure of the second tile region 522. Hereinafter, the first tile region 521 will be mainly described.

The first tile region 521 may be divided into first to fourth regions 521a to 521d. For example, the first tile region 521 may be divided into the first to fourth regions 521a to 521d according to a windmill structure. The first region 521a and the second region 521b may be adjacent to each other in the first direction X, and the third region 521c and the fourth region 521d may be adjacent to each other in the first direction X. The first region 521a and the third region 521c may be adjacent to each other in the second direction Y, and the second region 521b and the fourth region 521d may be adjacent to each other in the second direction Y. Hereinafter, components arranged in the first and second regions 521a and 521b will be mainly described.

In the first region 521a, a first row decoder RD1 for driving lower word lines WL1, a first global decoder GD1 for driving global lower word lines connected to the lower word lines WL1, a first sense amplifier SA1 for sensing first memory cells MC1, a second sense amplifier SA2 for sensing second memory cells MC2, a second global decoder GD2 for driving global upper word lines connected to upper word lines WL2, and a second row decoder RD2 for driving the upper word lines WL2 may be arranged in a line in the first direction X.

In the second region 521b, a first peripheral circuit PERI1 a global decoder GY, and a column decoder CD may be arranged in a line in the second direction Y. The column decoder CD is a circuit for driving the bit lines BL, and the global decoder GY is a circuit for driving global bit lines connected to the bit lines BL. The first peripheral circuit PERI1 may include, for example, a write driver (e.g., the write driver 122 in FIG. 2). However, the inventive concept is not limited thereto.

The first row decoder RD1 may be connected to the lower word line WL1 through a first contact plug CP1, and may be electrically connected to the first global decoder GD1 and the first sense amplifier SA1 through a contact plug CP and a metal pattern MP. The second row decoder RD2 may be connected to the upper word line WL2 through a second contact plug CP2, and may be electrically connected to the second global decoder GD2 and the second sense amplifier SA2 through a contact plug CP and a metal pattern MP. The column decoder CD may be connected to the bit line BL through a third contact plug CP3.

Figure 21:
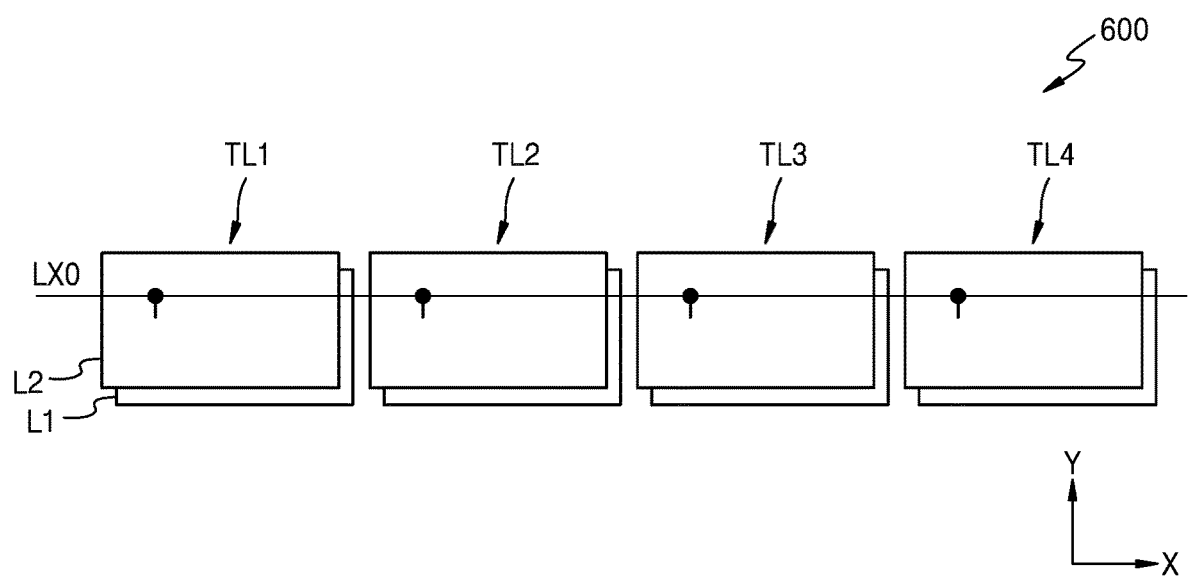
FIGS. 21 to 24 illustrate memory devices according to some embodiments of the inventive concept.

FIG. 21 illustrates a memory device 600 according to an embodiment of the inventive concept. Referring to FIG. 21, the memory device 600 may include first to fourth memory arrays, for example, first to fourth tiles TL1 to TL4, and the first to fourth tiles TL1 to TL4 may be arranged in a line in the first direction X. The first to fourth tiles TL1 to TL4 may be implemented based on the embodiments described above with reference to FIGS. 1 to 4, 5A, 5B, 6A, 6B, and 7 to 20. For example, each of the first to fourth tiles TL1 to TL4 may correspond to the first semiconductor layer 310 of FIG. 12.

Each of the first to fourth tiles TL1 to TL4 may include vertically stacked first and second layers L1 and L2, and the first and second layers L1 and L2 may share bit lines. In addition, word line select transistors in each of the first and second layers L1 and L2 may be driven by the same word line select signal LX0. Accordingly, read operations may be performed in parallel on eight memory cells in each of the first to fourth tiles TL1 to TL4 through voltage control of the word line select signal LX0. Accordingly, a read speed for the eight memory cells may be improved, and the read power consumption of the memory device 600 may be reduced.

Figure 22:
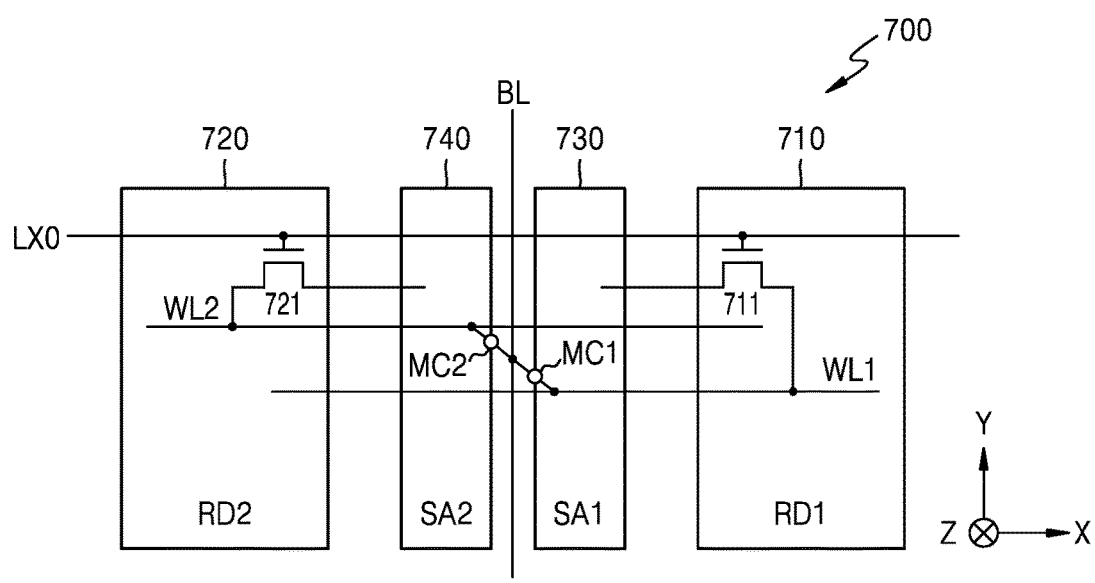

FIG. 22 illustrates a memory device 700 according to an embodiment of the inventive concept.

Referring to FIG. 22, the memory device 700 may include a second row decoder (RD2) 720, a second sense amplifier (SA2) 740, a first sense amplifier (SA1) 730, and a first row decoder (RD1) 710, which are arranged in a line in the first direction X. In an embodiment, the memory device 700 may have a COP structure, and the second row decoder 720, the second sense amplifier 740, the first sense amplifier 730, and the first row decoder 710 may be arranged below first and second memory cells MC1 and MC2 in the vertical direction Z.

A lower word line WL1 and an upper word line WL2 may extend in the first direction X, and the upper word line WL2 may be arranged above the lower word line WL1 in the vertical direction Z. A bit line BL may extend in the second direction Y. The first memory cell MC1 may be arranged in a region where the lower word line WL1 intersects the bit line BL, and the second memory cell MC2 may be arranged in a region where the upper word line WL2 intersects the bit line BL.

The first row decoder 710 may include a first row switch 711, and the first row switch 711 may be implemented as a transistor having a gate to which a word line select signal LX0 is applied. For example, the first row switch 711 may have a source connected to the lower word line WL1 and a drain connected to the first sense amplifier 730. According to an embodiment, a first global decoder (e.g., the first global decoder GD1 in FIG. 13 or 15) may be arranged between the first row decoder 710 and the first sense amplifier 730.

The second row decoder 720 may include a second row switch 721, and the second row switch 721 may be implemented as a transistor having a gate to which the word line select signal LX0 is applied. For example, the second row switch 721 may have a source connected to the upper word line WL2 and a drain connected to the second sense amplifier 740. According to an embodiment, a second global decoder (e.g., the second global decoder GD2 in FIG. 13 or 15) may be arranged between the second row decoder 720 and the second sense amplifier 740.

Figure 23:
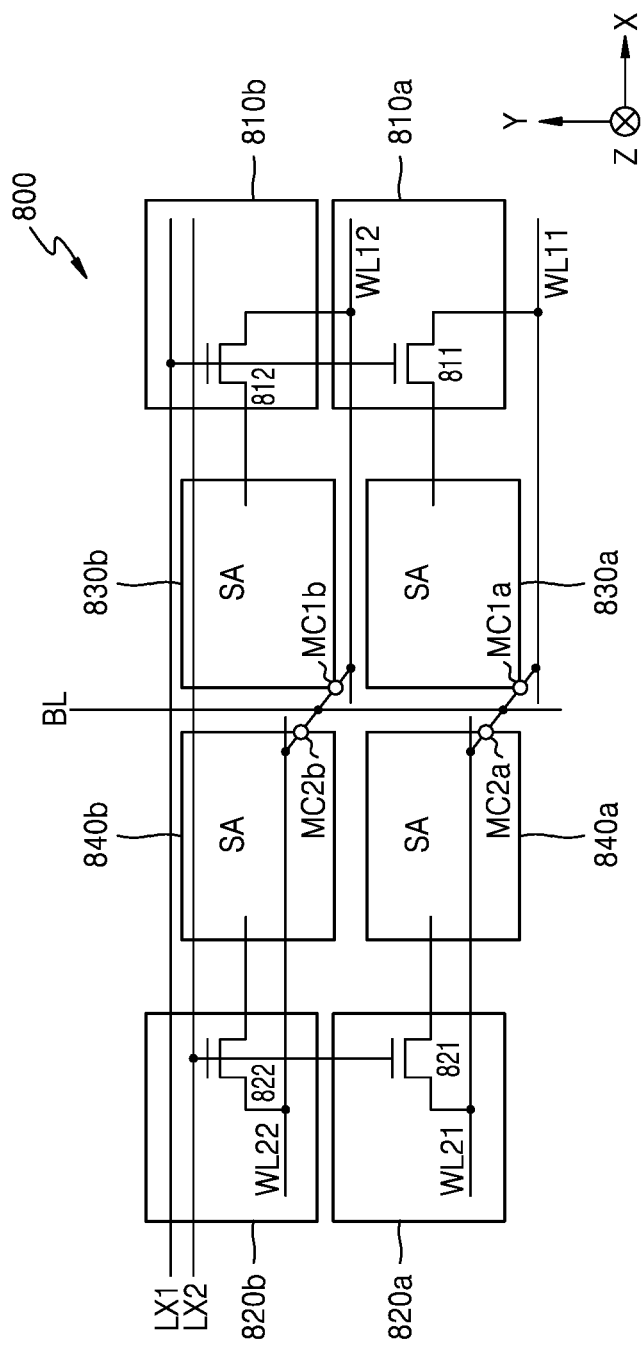

FIG. 23 illustrates a memory device 800 according to an embodiment of the inventive concept.

Referring to FIG. 23, the memory device 800 may include first row decoders 810a and 810b, second row decoders 820a and 820b, first sense amplifiers 830a and 830b, and second sense amplifiers 840a and 840b. The second row decoder 820a, the second sense amplifier 840a, the first sense amplifier 830a, and the first row decoder 810a may be arranged in a line in the first direction X. The second row decoder 820b, the second sense amplifier 840b, the first sense amplifier 830b, and the first row decoder 810b may be arranged in a line in the first direction X. In an embodiment, the memory device 800 may have a COP structure, and the first row decoders 810a and 810b, the second row decoders 820a and 820b, the first sense amplifiers 830a and 830b, and the second sense amplifiers 840a and 840b may be arranged below first memory cells MC1a and MC1b and second memory cells MC2a and MC2b in the vertical direction Z.

Lower word lines WL11 and WL12 and upper word lines WL21 and WL22 may extend in the first direction X. The upper word lines WL21 and WL22 may be respectively arranged above the lower word lines WL11 and WL12 in the vertical direction Z. A bit line BL may extend in the second direction Y. The first memory cell MC1a may be arranged in a region where the lower word line WL11 intersects the bit line BL, and the second memory cell MC2a may be arranged in a region where the upper word line WL21 intersects the bit line BL.

The first row decoder 810a may include a first row switch 811, and the first row switch 811 may be implemented as a transistor having a gate to which a first word line select signal LX1 is applied. For example, the first row switch 811 may have a source connected to the lower word line WL11 and a drain connected to the first sense amplifier 830a. The first row decoder 810b may include a first row switch 812, and the first row switch 812 may be implemented as a transistor having a gate to which the first word line select signal LX1 is applied. For example, the first row switch 812 may have a source connected to the lower word line WL12 and a drain connected to the first sense amplifier 830b. According to the driving of the first word line select signal LX1, the first row switches 811 and 812 may be simultaneously driven, and read operations on the first memory cells MC1a and MC1b may be performed in parallel by using the first sense amplifiers 830a and 830b.

The second row decoder 820a may include a second row switch 821, and the second row switch 821 may be implemented as a transistor having a gate to which a second word line select signal LX2 is applied. For example, the second row switch 821 may have a source connected to the upper word line WL21 and a drain connected to the second sense amplifier 840a. The second row decoder 820b may include a second row switch 822, and the second row switch 822 may be implemented as a transistor having a gate to which the second word line select signal LX2 is applied. For example, the second row switch 822 may have a source connected to the upper word line WL22 and a drain connected to the second sense amplifier 840b. According to the driving of the second word line select signal LX2, the second row switches 821 and 822 may be simultaneously driven, and read operations for the second memory cells MC2a and MC2b may be performed in parallel by using the second sense amplifiers 840a and 840b.

According to an embodiment, a first global decoder (e.g., the first global decoder GD1 in FIG. 13 or 15) may be arranged between the first row decoder 810a and the first sense amplifier 830a and between the first row decoder 810b and the first sense amplifier 830b. In addition, according to an embodiment, a second global decoder (e.g., the second global decoder GD2 in FIG. 13 or 15) may be arranged between the second row decoder 820a and the second sense amplifier 840a and between the second row decoder 820b and the second sense amplifier 840b.

As such, the memory device 800 may include four sense amplifiers, for example, the first sense amplifiers 830a and 830b and the second sense amplifiers 840a and 840b, and by controlling the first and second word line select signals LX1 and LX2, read operations for the four memory cells, for example, the first memory cells MC1a and MC1b and the second memory cells MC2a and MC2b may be performed in parallel. Accordingly, a read speed for the first memory cells MC1a and MC1b and the second memory cells MC2a and MC2b may be improved, and the read power consumption of the memory device 800 may be reduced. In some examples, the first and second word line select signals LX1 and LX2 may be generated based on t an address associated with the same page of the memory cell array. In some examples, in a certain mode of the memory device, each of the first and second word line select signals LX1 and LX2 may be generated based on a different address. In this case, a read operation of the first memory cells MC1a and MC1b and a read operation of the second memory cells MC2a and MC2b may be independently performed.

Figure 24:
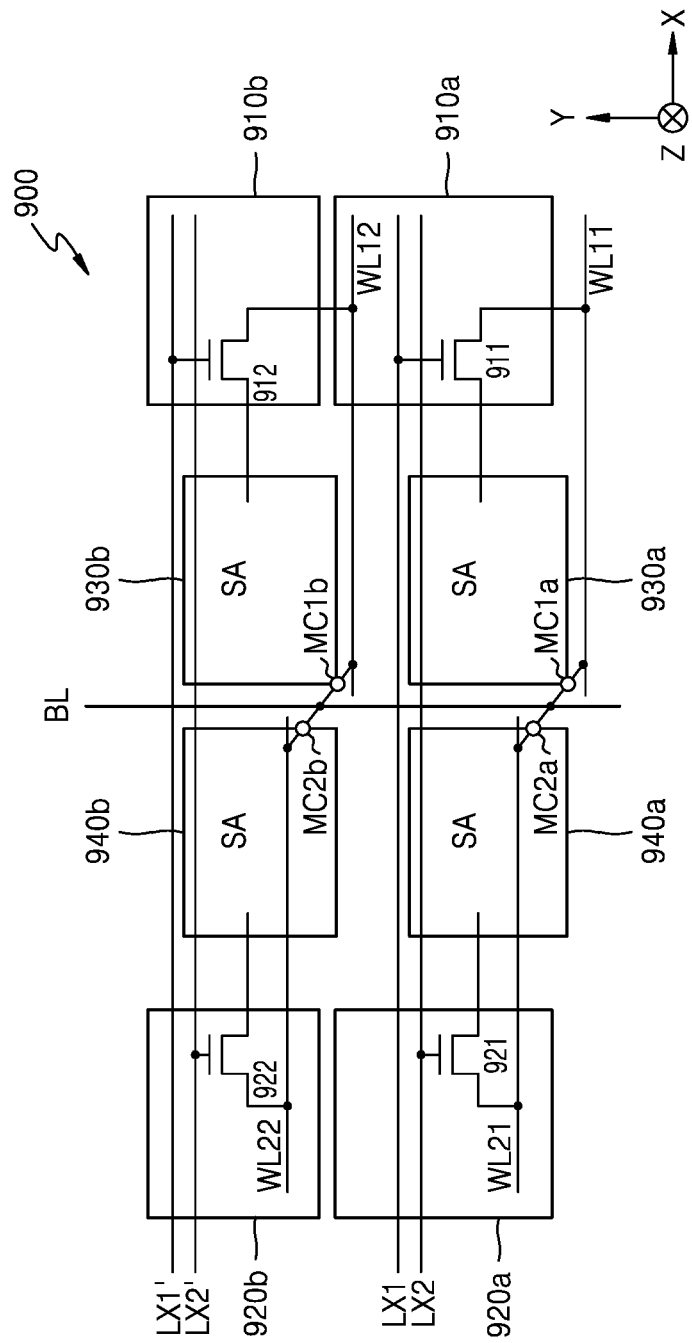

FIG. 24 illustrates a memory device 900 according to an embodiment of the inventive concept.

Referring to FIG. 24, the memory device 900 may include first row decoders 910a and 910b, second row decoders 920a and 920b, first sense amplifiers 930a and 930b, and second sense amplifiers 940a and 940b. The second row decoder 920a, the second sense amplifier 940a, the first sense amplifier 930a, and the first row decoder 910a may be arranged in a line in the first direction X. The second row decoder 920b, the second sense amplifier 940b, the first sense amplifier 930b, and the first row decoder 910b may be arranged in a line in the first direction X. In an embodiment, the memory device 900 may have a COP structure, and the first row decoders 910a and 910b, the second row decoders 920a and 920b, the first sense amplifiers 930a and 930b, and the second sense amplifiers 940a and 940b may be arranged below the first memory cells MC1a and MC1b and the second memory cells MC2a and MC2b in the vertical direction Z.

The first row decoder 910a may include a first row switch 911, and the first row switch 911 may be implemented as a transistor having a gate to which a first word line select signal LX1 is applied. For example, the first row switch 911 may have a source connected to a lower word line WL11 and a drain connected to the first sense amplifier 930a. The first row decoder 910b may include a first row switch 912, and the first row switch 912 may be implemented as a transistor having a gate to which a first word line select signal LX1' is applied. For example, the first row switch 912 may have a source connected to a lower word line WL12 and a drain connected to the first sense amplifier 930b. According to the driving of the first word line select signals LX1 and LX1', the first row switches 911 and 912 may be simultaneously driven, and read operations for the first memory cells MC1a and MC1b may be performed in parallel by using the first sense amplifiers 930a and 930b.

The second row decoder 920a may include a second row switch 921, and the second row switch 921 may be implemented as a transistor having a gate to which a second word line select signal LX2 is applied. For example, the second row switch 921 may have a source connected to an upper word line WL21 and a drain connected to the second sense amplifier 940a. The second row decoder 920b may include a second row switch 922, and the second row switch 922 may be implemented as a transistor having a gate to which a second word line select signal LX2' is applied. For example, the second row switch 922 may have a source connected to an upper word line WL22 and a drain connected to the second sense amplifier 940b. According to the driving of the second word line select signals LX2 and LX2', the second row switches 921 and 922 may be simultaneously driven, and read operations for the second memory cells MC2*a* and MC2*b* may be performed in parallel by using the second sense amplifiers 940*a* and 940*b*.

According to an embodiment, a first global decoder (e.g., the first global decoder GD1 in FIG. 13 or 15) may be arranged between the first row decoder 910*a* and the first sense amplifier 930*a* and between the first row decoder 910*b* and the first sense amplifier 930*b*. In addition, according to an embodiment, a second global decoder (e.g., the second global decoder GD2 in FIG. 13 or 15) may be arranged between the second row decoder 920*a* and the second sense amplifier 940*a* and between the second row decoder 920*b* and the second sense amplifier 940*b*.

As such, the memory device 900 may include four sense amplifiers, that is, the first sense amplifiers 930*a* and 930*b* and the second sense amplifiers 940*a* and 940*b*, and by controlling the first word line select signals LX1 and LX1' and the second word line select signals LX2 and LX2', read operations for the four memory cells, for example, the first memory cells MC1*a* and MC1*b* and the second memory cells MC2*a* and MC2*b* may be performed in parallel. Accordingly, a read speed for the first memory cells MC1*a* and MC1*b* and the second memory cells MC2*a* and MC2*b* may be improved. In some examples, the first word line select signals LX1 and LX1' and the second word line select signals LX2 and LX2' may be generated based on an address associated with the same page of the memory cell array. In some examples, in a certain mode of the memory device, each of the first word line select signals LX1 and LX1' and the second word line select signals LX2 and LX2' may be generated based on a different address. In this case, a read operation of each memory cell of the first memory cells MC1*a* and MC1*b* and the second memory cells MC2*a* and MC2*b* may be independently performed.

Figure 25:
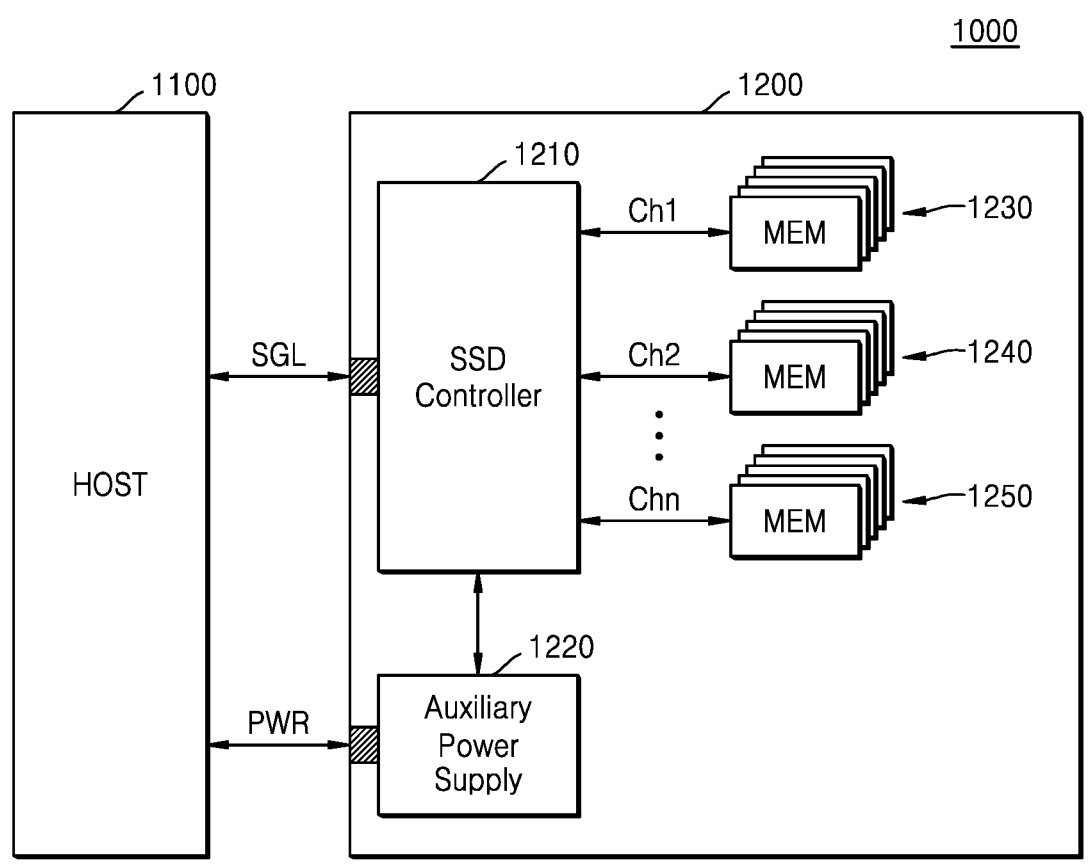
FIG. 25 is a block diagram illustrating an example in which a memory device according to some embodiments of the inventive concept is applied to a solid state drive (SSD) system.

FIG. 25 is a block diagram illustrating an example in which a memory device according to some embodiments of the inventive concept is applied to a solid state drive (SSD) system 1000. Referring to FIG. 25, the SSD system 1000 may include a host 1100 and an SSD 1200. The SSD 1200 may exchange signals SGL with the host 1100 through a signal connector and receive power PWR through a power connector. The SSD 1200 may include an SSD controller 1210, an auxiliary power supply 1220, and memory devices (MEM) 1230, 1240, . . . , and 1250. The SSD controller 1210 may communicate with the memory devices 1230, 1240, . . . , and 1250 respectively through channels Ch1, Ch2, . . . , and Chn. The memory devices 1230, 1240, . . . , and 1250 may be implemented using the embodiments described above with reference to FIGS. 1 to 4, 5A, 5B, 6A, 6B, and 7 to 24.

Figure 26:
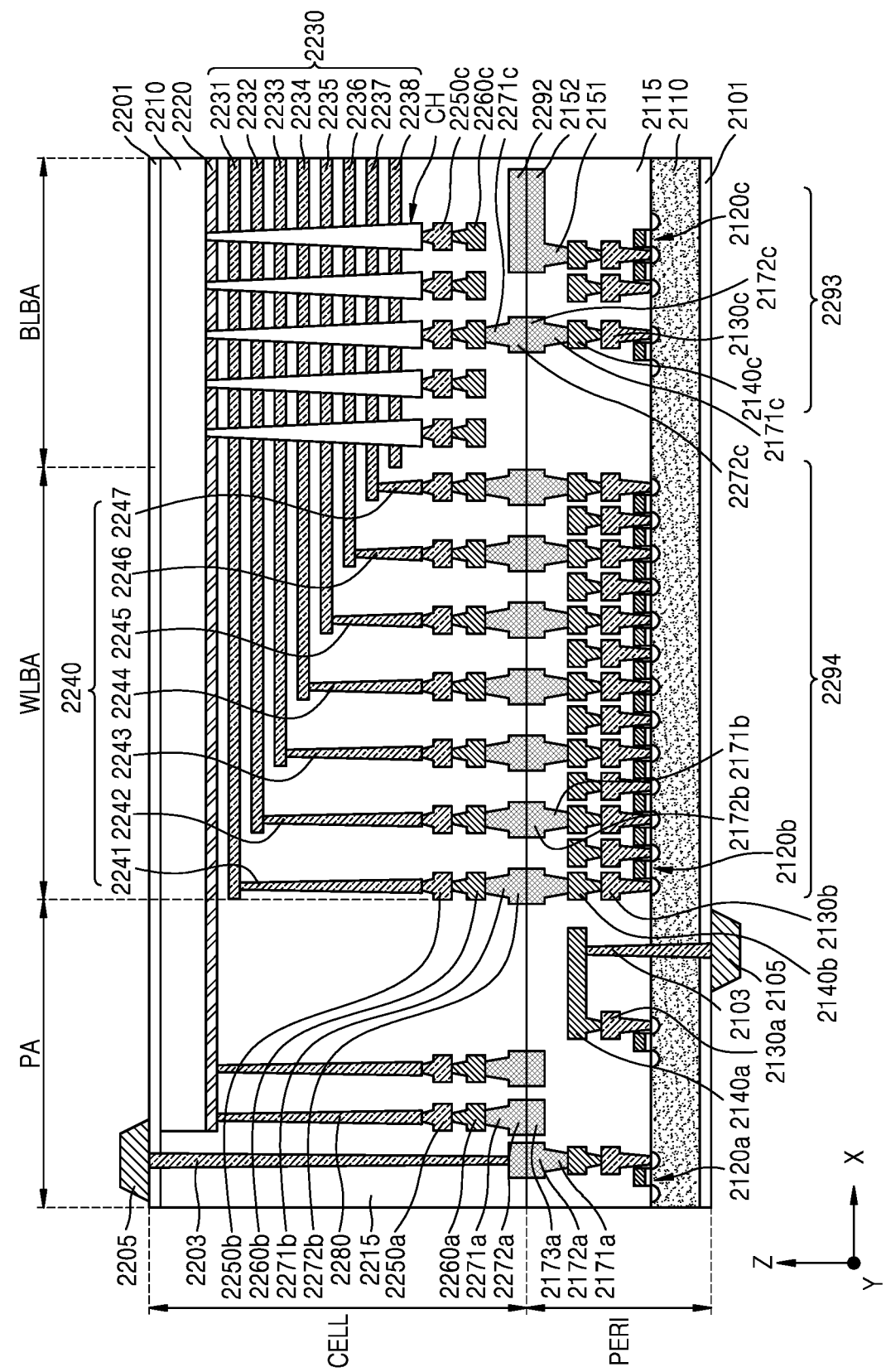
FIG. 26 is a cross-sectional view illustrating a memory device having a chip-to-chip structure, according to some embodiments of the inventive concept.

FIG. 26 is a cross-sectional view illustrating a memory device having a chip-to-chip structure, according to some embodiments of the inventive concept.

Referring to FIG. 26, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2110, an interlayer insulating layer 2115, a plurality of circuit elements 2120*a*, 2120*b*, and 2120*c* formed on the first substrate 2110, first metal layers 2130*a*, 2130*b*, and 2130*c* respectively connected to the plurality of circuit elements 2120*a*, 2120*b*, and 2120*c*, and second metal layers 2140*a*, 2140*b*, and 2140*c* formed on the first metal layers 2130*a*, 2130*b*, and 2130*c*. Each of the circuit elements 2120*a*, 2120*b*, and 2120*c* may include one or more transistors. In an example embodiment, the first metal layers 2130*a*, 2130*b*, and 2130*c* may be formed of tungsten having relatively high resistance, and the second metal layers 2140*a*, 2140*b*, and 2140*c* may be formed of copper having relatively low resistance.

In an example embodiment illustrate in FIG. 26, although the first metal layers 2130*a*, 2130*b*, and 2130*c* and the second metal layers 2140*a*, 2140*b*, and 2140*c* are shown and described, they are not limited thereto, and one or more metal layers may be further formed on the second metal layers 2140*a*, 2140*b*, and 2140*c*. At least a portion of the one or more metal layers formed on the second metal layers 2140*a*, 2140*b*, and 2140*c* may be formed of aluminum or the like having a lower resistance than those of copper forming the second metal layers 2140*a*, 2140*b*, and 2140*c*.

The interlayer insulating layer 2115 may be disposed on the first substrate 2110 and cover the plurality of circuit elements 2120*a*, 2120*b*, and 2120*c*, the first metal layers 2130*a*, 2130*b*, and 2130*c*, and the second metal layers 2140*a*, 2140*b*, and 2140*c*. The interlayer insulating layer 2115 may include an insulating material such as silicon oxide, silicon nitride, or the like.

Lower bonding metals 2171*b* and 2172*b* may be formed on the second metal layer 2140*b* in the word line bonding area WLBA. In the word line bonding area WLBA, the lower bonding metals 2171*b* and 2172*b* in the peripheral circuit region PERI may be electrically connected to upper bonding metals 2271*b* and 2272*b* in the cell region CELL in a bonding manner, and the lower bonding metals 2171*b* and 2172*b* and the upper bonding metals 2271*b* and 2272*b* may be formed of aluminum, copper, tungsten, or the like. Further, the upper bonding metals 2271*b* and 2272*b* in the cell region CELL may be referred as first metal pads and the lower bonding metals 2171*b* and 2172*b* in the peripheral circuit region PERI may be referred as second metal pads.

The cell region CELL may include at least one memory block. The cell region CELL may include a second substrate 2210 and a common source line 2220. On the second substrate 2210, a plurality of word lines 2231 to 2238 (i.e., 2230) may be stacked in a direction (a Z-axis direction), perpendicular to an upper surface of the second substrate 2210. At least one string select line and at least one ground select line may be arranged on and below the plurality of word lines 2230, respectively, and the plurality of word lines 2230 may be disposed between the at least one string select line and the at least one ground select line.

In the bit line bonding area BLBA, a channel structure CH may extend in a direction, perpendicular to the upper surface of the second substrate 2210, and pass through the plurality of word lines 2230, the at least one string select line, and the at least one ground select line. The channel structure CH may include a data storage layer, a channel layer, a buried insulating layer, and the like, and the channel layer may be electrically connected to a third metal layer 2250*c* and a fourth metal layer 2260c. For example, the third metal layer 2250c may be a bit line contact, and the fourth metal layer 2260c may be a bit line. In an example embodiment, the bit line 2260c may extend in a first direction (a Y-axis direction), parallel to the upper surface of the second substrate 2210.

In an example embodiment illustrated in FIG. 26, an area in which the channel structure CH, the bit line 2260c, and the like are disposed may be defined as the bit line bonding area BLBA. In the bit line bonding area BLBA, the bit line 2260c may be electrically connected to the circuit elements 2120c providing a page buffer 2293 in the peripheral circuit region PERI. For example, the bit line 2260c may be connected to upper bonding metals 2271c and 2272c in the cell region CELL, and the upper bonding metals 2271c and 2272c may be connected to lower bonding metals 2171c and 2172c connected to the circuit elements 2120c of the page buffer 2293.

In the word line bonding area WLBA, the plurality of word lines 2230 may extend in a second direction (an X-axis direction), parallel to the upper surface of the second substrate 2210, and may be connected to a plurality of cell contact plugs 2241 to 2247 (i.e., 2240). The plurality of word lines 2230 and the plurality of cell contact plugs 2240 may be connected to each other in pads provided by at least a portion of the plurality of word lines 2230 extending in different lengths in the second direction. A third metal layer 2250b and a fourth metal layer 2260b may be connected to an upper portion of the plurality of cell contact plugs 2240 connected to the plurality of word lines 2230, sequentially. The plurality of cell contact plugs 2240 may be connected to the circuit region PERI by the upper bonding metals 2271b and 2272b of the cell region CELL and the lower bonding metals 2171b and 2172b of the peripheral circuit region PERI in the word line bonding area WLBA.

The plurality of cell contact plugs 2240 may be electrically connected to the circuit elements 2120b providing a row decoder 2294 in the peripheral circuit region PERI. In an example embodiment, operating voltages of the circuit elements 2120b providing the row decoder 2294 may be different than operating voltages of the circuit elements 2120c providing the page buffer 2293. For example, operating voltages of the circuit elements 2120c providing the page buffer 2293 may be greater than operating voltages of the circuit elements 2120b providing the row decoder 2294.

A common source line contact plug 2280 may be disposed in the external pad bonding area PA. The common source line contact plug 2280 may be formed of a conductive material such as a metal, a metal compound, polysilicon, or the like, and may be electrically connected to the common source line 2220. A third metal layer 2250a and a fourth metal layer 2260a may be stacked on an upper portion of the common source line contact plug 2280, sequentially. For example, an area in which the common source line contact plug 2280, the third metal layer 2250a, and the fourth metal layer 2260a are disposed may be defined as the external pad bonding area PA.

Input-output pads 2105 and 2205 may be disposed in the external pad bonding area PA. Referring to FIG. 26, a lower insulating film 2101 covering a lower surface of the first substrate 2110 may be formed below the first substrate 2110, and a first input-output pad 2105 may be formed on the lower insulating film 2101. The first input-output pad 2105 may be connected to at least one of the plurality of circuit elements 2120a, 2120b, and 2120c disposed in the peripheral circuit region PERI through a first input-output contact plug 2103, and the first input-output pad 2105 may be separated from the first substrate 2110 by the lower insulating film 2101. In addition, a side insulating film may be disposed between the first input-output contact plug 2103 and the first substrate 2110 to electrically separate the first input-output contact plug 2103 and the first substrate 2110.

Referring to FIG. 26, an upper insulating film 2201 covering the upper surface of the second substrate 2210 may be formed on the second substrate 2210, and a second input-output pad 2205 may be disposed on the upper insulating layer 2201. The second input-output pad 2205 may be connected to at least one of the plurality of circuit elements 2120a, 2120b, and 2120c disposed in the peripheral circuit region PERI through a second input-output contact plug 2203.

According to embodiments, the second substrate 2210 and the common source line 2220 may not be disposed in an area in which the second input-output contact plug 2203 is disposed. Also, the second input-output pad 2205 may not overlap the word lines 2230 in the third direction (the Z-axis direction). Referring to FIG. 26, the second input-output contact plug 2203 may be separated from the second substrate 2210 in a direction, parallel to the upper surface of the second substrate 2210, and may pass through an interlayer insulating layer 2215 of the cell region CELL to be connected to the second input-output pad 2205 and an upper metal pattern 2272a of the cell region CELL.

According to embodiments, the first input-output pad 2105 and the second input-output pad 2205 may be selectively formed. For example, the memory device 2000 may include only the first input-output pad 2105 disposed on the lower insulating film 2101 in contact with the first substrate 2110 or the second input-output pad 2205 disposed on the upper insulating film 2201 in contact with the second substrate 2210. Alternatively, the memory device 2000 may include both the first input-output pad 2105 and the second input-output pad 2205.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2173a, corresponding to the upper metal pattern 2272a formed in an uppermost metal layer of the cell region CELL, and having the same shape as the upper metal pattern 2272a of the cell region CELL, in an uppermost metal layer of the peripheral circuit region PERI. In the peripheral circuit region PERI, the lower metal pattern 2173a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2171b and 2172b may be formed on the second metal layer 2140b in the word line bonding area WLBA. In the word line bonding area WLBA, the lower bonding metals 2171b and 2172b of the peripheral circuit region PERI may be electrically connected to the upper bonding metals 2271b and 2272b of the cell region CELL by a Cu—Cu bonding.

Further, the bit line bonding area BLBA, an upper metal pattern 2292, corresponding to a lower metal pattern 2152 formed in the uppermost metal layer of the peripheral circuit region PERI, and having the same shape as the lower metal pattern 2152 of the peripheral circuit region PERI, may be formed in an uppermost metal layer of the cell region CELL. A contact may not be formed on the upper metal pattern 2292 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In an example embodiment, the memory device 2000, such as described in FIG. 26, can operate and can include device components according to one or more of the example embodiments described previously.

While the inventive concept has been particularly shown and described with reference to embodiments thereof, it will be understood that various changes in form and details may be made therein without departing from the spirit and scope of the following claims.

What is claimed is:

1. A three-dimensional (3D) memory device comprising:
   a memory cell array including a plurality of lower memory cells respectively arranged in regions where a plurality of lower word lines intersect with a plurality of bit lines and a plurality of upper memory cells respectively arranged in regions where a plurality of upper word lines intersect with the plurality of bit lines;
   a first row decoder including a plurality of lower row switches respectively connected to a corresponding one of the plurality of lower word lines, the first row decoder performing a selection operation on the plurality of lower word lines;
   a second row decoder including a plurality of upper row switches respectively connected to a corresponding one of the plurality of upper word lines, the second row decoder performing a selection operation on the plurality of upper word lines;
   a first sense amplifier connected to a first lower word line of the plurality of lower word lines, the first sense amplifier configured to perform a data sensing operation on a first lower memory cell connected between a first bit line of the plurality of bit lines and the first lower word line; and
   a second sense amplifier connected to a first upper word line of the plurality of upper word lines, the second sense amplifier configured to perform a data sensing operation on a first upper memory cell connected between the first bit line and the first upper word line,
   wherein the data sensing operation of the first sense amplifier and the data sensing operation of the second sense amplifier are performed in parallel.

2. The 3D memory device of claim 1, wherein a first lower row switch connected to the first lower word line from among the plurality of lower row switches and a first upper row switch connected to the first upper word line from among the plurality of upper row switches are driven by the same row address.

3. The 3D memory device of claim 1, wherein the plurality of lower word lines further includes a second lower word line,
   wherein the plurality of lower row switches include a first lower row switch connected to the first lower word line, and a second lower row switch connected to the second lower word line, and
   wherein the 3D memory device further comprises:
   a third sense amplifier connected to the second lower word line, the third sense amplifier configured to perform a data sensing operation on a second lower memory cell connected between the first bit line and the second lower word line.

4. The 3D memory device of claim 3, wherein the first lower row switch and the second lower row switch are driven by the same word line select signal.

5. The 3D memory device of claim 3, wherein the first lower row switch is driven by a first word line select signal, and
   wherein the second lower row switch is driven by a second word line select signal.

6. The 3D memory device of claim 1, wherein the plurality of upper word lines further include a second upper word line,
   wherein the second row decoder includes a first upper row switch connected to the first upper word line and a second upper row switch connected to the second upper word line, and
   wherein the 3D memory device further comprises a fourth sense amplifier connected to the second upper word line, the fourth sense amplifier configured to perform a data sensing operation on a second upper memory cell connected between the first bit line and the second upper word line.

7. The 3D memory device of claim 6, wherein the first upper row switch and the second upper row switch are driven by the same word line select signal.

8. The 3D memory device of claim 6, wherein the first upper row switch is driven by a first word line select signal, and
   wherein the second upper row switch is driven by a second word line select signal.

9. A method of reading data by a three-dimensional (3D) memory device, the method comprising:
   receiving a read command for a lower memory cell and an upper memory cell included in the 3D memory device;
   pre-charging a lower word line connected to the lower memory cell and an upper word line connected to the upper memory cell in a first pre-charge period, in response to the read command;
   pre-charging a bit line between the lower memory cell and the upper memory cell in a second pre-charge period after the first pre-charge period;
   connecting the lower word line to a first data line and connecting the upper word line to a second data line; and
   sensing first data stored in the lower memory cell based on a voltage level of the first data line, and sensing second data stored in the upper memory cell based on a voltage level of the second data line.

10. The method of claim 9, wherein the pre-charging of the lower word line and the upper word line comprising:
    applying a first word-line pre-charge voltage to the lower word line in the first pre-charge period; and
    applying a second word-line pre-charge voltage to the upper word line in the first pre-charge period,
    wherein a voltage level of each of the first and second word line pre-charge voltages is a negative voltage.

11. The method of claim 9, wherein the lower word line and the upper word line are floated in the second pre-charge period.

12. The method of claim 9, wherein the lower word line and the upper word line are pseudo-floated in the second pre-charge period.

13. The method of claim 9, wherein the lower word line and the upper word line are floated in a first interval of the second pre-charge period, and pseudo-floated in a second interval of the second pre-charge period after the first interval of the second pre-charge period.

14. The method of claim 9, wherein when the lower word line and the first data line are electrically connected to each other, charge sharing is performed between the lower word line and the first data line and voltage levels of the lower word line and the first data line are equal to each other.

15. The method of claim 14, wherein when the lower memory cell is in a set state, the voltage level of the first data line is relatively high, and wherein when the lower memory cell is in a reset state, the voltage level of the first data line is relatively low.

16. The method of claim 9, wherein the sensing of the first data comprising:

comparing the voltage level of the first data line with a reference voltage; and outputting a comparison result as the first data.

17. The method of claim 16, wherein the reference voltage corresponds to an intermediate level between the voltage level of the first data line when the lower memory cell is in a set state and the voltage level of the first data line when the lower memory cell is in a reset state.

18. The method of claim 9, wherein the sensing of the first data and the sensing of the second data are performed in parallel.

19. The method of claim 9, wherein each of the lower and upper memory cells includes a selection element and a variable resistance element connected in series, and wherein the variable resistance element includes a phase change material.

20. The method of claim 9, wherein the lower and upper memory cells are formed on a first semiconductor layer, wherein the 3D memory device further include first and second sense amplifiers formed on a second semiconductor layer, and wherein the first semiconductor layer and the second semiconductor layer are stacked in a vertical direction and thus the 3D memory device has a cell over peripheral (COP) structure.

* * * * *